US006877061B2

United States Patent
Thibault et al.

(10) Patent No.: US 6,877,061 B2
(45) Date of Patent: *Apr. 5, 2005

(54) DATA STORAGE SYSTEM HAVING DUMMY PRINTED CIRCUIT BOARDS

(75) Inventors: Robert A. Thibault, Westboro, MA (US); Daniel Castel, Boston, MA (US); Brian Gallagher, Southboro, MA (US); Paul C. Wilson, Mendon, MA (US); John K. Walton, Mendon, MA (US); Christopher S. MacLellan, Walpole, MA (US)

(73) Assignee: EMC Corporation, Hopkinton, MA (US)

( * ) Notice: Subject to any disclaimer, the term of this patent is extended or adjusted under 35 U.S.C. 154(b) by 343 days.

This patent is subject to a terminal disclaimer.

(21) Appl. No.: 10/112,598

(22) Filed: Mar. 28, 2002

(65) Prior Publication Data

US 2003/0140192 A1 Jul. 24, 2003

Related U.S. Application Data

(63) Continuation-in-part of application No. 09/540,828, filed on Mar. 31, 2000, and a continuation-in-part of application No. 09/606,730, filed on Jun. 29, 2000, which is a continuation of application No. 09/540,828, filed on Mar. 31, 2000.

(51) Int. Cl.[7] .......................... G06F 13/00; G06F 13/14; H05K 7/10
(52) U.S. Cl. ....................... 710/312; 710/305; 710/313; 710/316; 710/104; 710/300
(58) Field of Search ............................... 710/305–306, 710/308–317, 7–11, 31–39, 111–119, 4–5

(56) References Cited

U.S. PATENT DOCUMENTS 950,579 A     3/1910   Seitz (Continued)

FOREIGN PATENT DOCUMENTS

GB          950 579        2/1964

(Continued)

OTHER PUBLICATIONS

International Search Report from PCT/US03/09112 dated Apr. 7, 2004.

(Continued)

*Primary Examiner*—Paul R. Myers
*Assistant Examiner*—Raymond N Phan

(57) ABSTRACT

A method and system for producing a data storage system for transferring data between a host computer/server and a bank of disk drives through a system interface. The system interface has a plurality of first directors, a plurality of second directors, and a global memory. The method includes: providing a backplane having slots adapted to have plugged therein a plurality of printed circuit board. The printed circuit boards include: a plurality of first director boards having the first directors; a plurality of second printed circuit boards having the second directors; a plurality of memory printed circuit boards providing the global memory; a plurality of dummy first director boards having first jumpers; a plurality of dummy second director boards having second jumpers; a plurality of dummy memory boards having third jumpers. The method includes wiring the backplane to effect a connection among the first, second and third jumpers to interconnect the first plurality of director to the host computer/server, the plurality of second plurality of directors to the bank of disk drives and the global memory to the first plurality of directors and to the second plurality of director. The method and system allows the same wired backplane to be used with systems having a different number of memory and director boards and still enable dual-write and redundancy to the global memory.

7 Claims, 13 Drawing Sheets

U.S. PATENT DOCUMENTS

| | | | |
|---|---|---|---|
| 4,575,780 A | | 3/1986 | Brombal et al. |
| 5,212,768 A | * | 5/1993 | Itsuki et al. .................. 706/50 |
| 5,214,768 A | * | 5/1993 | Martin et al. ................ 711/114 |
| 5,261,115 A | * | 11/1993 | Saunders et al. ........... 710/104 |
| 5,819,054 A | * | 10/1998 | Ninomiya et al. ............. 712/3 |
| 5,903,911 A | * | 5/1999 | Gaskins ...................... 711/141 |
| 5,943,287 A | * | 8/1999 | Walton .................. 365/230.03 |
| 6,058,451 A | * | 5/2000 | Bermingham et al. ...... 711/106 |
| 6,289,398 B1 | * | 9/2001 | Stallmo et al. ................. 710/5 |
| 6,295,571 B1 | * | 9/2001 | Scardamalia et al. ....... 710/308 |

FOREIGN PATENT DOCUMENTS

| | | |
|---|---|---|
| GB | 2258770 A | 2/1993 |
| GB | 2366425 A | 3/2002 |

OTHER PUBLICATIONS

U.S. Appl. No. 10/109,583, filed Mar. 28, 2002.

* cited by examiner

DATA STORAGE SYSTEM HAVING DUMMY PRINTED CIRCUIT BOARDS

RELATED APPLICATIONS

This application is a continuation-in-part of co-pending patent application Ser. No. 09/540,828, filed Mar. 31, 2000, entitled "Data Storage System Having Separate Data Transfer Section And Message Network" inventors Yuval Ofek et al. and a continuation-in-part of co-pending patent application Ser. No. 09/606,730 filed Jun. 29, 2000 which is a continuation of co-pending patent application Ser. No. 09/540,828, filed Mar. 31, 2000, entitled "Data Storage System Having Separate Data Transfer Section And Message Network" inventors Yuval Ofek et al. This application claims the benefit of the filing dates of such co-pending applications under 35 U.S.C. 120.

INCORPORATION BY REFERENCE

This application incorporates by reference, in their entirety, the following co-pending patent applications all assigned to the same assignee as the present invention:

| INVENTORS | FILING DATE | SERIAL NO. | TITLE |
| --- | --- | --- | --- |
| Yuval Ofek et al. | Mar. 31, 2000 | 09/540,828 | Data Storage System Having Separate Data Transfer Section And Message Network |
| Paul C. Wilson et al. | Jun. 29, 2000 | 09/606,730 | Data Storage System Having Point-To-Point Configuration |
| John K. Walton et al. | Jan. 22, 2002 | 10/054,241 | Data Storage System (Divisional of 09/223,519 filed Dec. 30, 1998) |
| Christopher S. MacLellan et al. | Dec. 21, 2000 | 09/745,859 | Data Storage System Having Plural Fault Domains |
| John K. Walton | May 17, 2001 | 09/859,659 | Data Storage System Having No-Operation Command |

TECHNICAL FIELD

This invention relates generally to data storage systems, and more particularly to data storage systems having redundancy arrangements to protect against total system failure in the event of a failure in a component or subassembly of the storage system.

BACKGROUND

As is known in the art, large host computers and servers (collectively referred to herein as "host computer/servers") require large capacity data storage systems. These large computer/servers generally includes data processors, which perform many operations on data introduced to the host computer/server through peripherals including the data storage system. The results of these operations are output to peripherals, including the storage system.

One type of data storage system is a magnetic disk storage system. Here a bank of disk drives and the host computer/server are coupled together through an interface. The interface includes "front end" or host computer/server controllers (or directors) and "back-end" or disk controllers (or directors). The interface operates the controllers (or directors) in such a way that they are transparent to the host computer/server. That is, data is stored in, and retrieved from, the bank of disk drives in such a way that the host computer/server merely thinks it is operating with its own local disk drive. One such system is described in U.S. Pat. No. 5,206,939, entitled "System and Method for Disk Mapping and Data Retrieval", inventors Moshe Yanai, Natan Vishlitzky, Bruno Alterescu and Daniel Castel, issued Apr. 27, 1993, and assigned to the same assignee as the present invention.

As described in such U.S. Patent, the interface may also include, in addition to the host computer/server controllers (or directors) and disk controllers (or directors), addressable cache memories. The cache memory is a semiconductor memory and is provided to rapidly store data from the host computer/server before storage in the disk drives, and, on the other hand, store data from the disk drives prior to being sent to the host computer/server. The cache memory being a semiconductor memory, as distinguished from a magnetic memory as in the case of the disk drives, is much faster than the disk drives in reading and writing data.

The host computer/server controllers, disk controllers and cache memory are interconnected through a backplane printed circuit board. More particularly, disk controllers are mounted on disk controller printed circuit boards. The host computer/server controllers are mounted on host computer/server controller printed circuit boards. And, cache memories are mounted on cache memory printed circuit boards. The disk directors, host computer/server directors, and cache memory printed circuit boards plug into the backplane printed circuit board. In order to provide data integrity in case of a failure in a director, the backplane printed circuit board has a pair of buses. One set the disk directors is connected to one bus and another set of the disk directors is connected to the other bus. Likewise, one set the host computer/server directors is connected to one bus and another set of the host computer/server directors is directors connected to the other bus. The cache memories are connected to both buses. Each one of the buses provides data, address and control information.

The arrangement is shown schematically in FIG. 1. Thus, the use of two buses B1, B2 provides a degree of redundancy to protect against a total system failure in the event that the controllers or disk drives connected to one bus, fail. Further, the use of two buses increases the data transfer bandwidth of the system compared to a system having a single bus. Thus, in operation, when the host computer/server 12 wishes to store data, the host computer 12 issues a write request to one of the front-end directors 14 (i.e., host computer/server directors) to perform a write command. One of the front-end directors 14 replies to the request and asks the host computer 12 for the data. After the request has passed to the requesting one of the front-end directors 14, the director 14 determines the size of the data and reserves space in the cache memory 18 to store the request. The front-end director 14 then produces control signals on one of the address memory busses B1, B2 connected to such front-end director 14 to enable the transfer to the cache memory 18. The host computer/server 12 then transfers the data to the front-end director 14. The front-end director 14 then advises the host computer/server 12 that the transfer is complete. The front-end director 14 looks up in a Table, not shown, stored in the cache memory 18 to determine which one of the back-end directors 20 (i.e., disk directors) is to handle this request. The Table maps the host computer/server 12 addresses into an address in the bank 14 of disk drives. The front-end director 14 then puts a notification in a "mail box" (not shown and stored in the cache memory 18) for the back-end director 20, which is to handle the request, the amount of the data and the disk address for the data. Other back-end directors 20 poll the cache memory 18 when they are idle to check their "mail boxes". If the polled "mail box" indicates a transfer is to be made, the back-end director 20 processes the request, addresses the disk drive in the bank 22, reads the data from the cache memory 18 and writes it into the addresses of a disk drive in the bank 22.

When data is to be read from a disk drive in bank 22 to the host computer/server 12 the system operates in a reciprocal manner. More particularly, during a read operation, a read request is instituted by the host computer/server 12 for data at specified memory locations (i.e., a requested data block). One of the front-end directors 14 receives the read request and examines the cache memory 18 to determine whether the requested data block is stored in the cache memory 18. If the requested data block is in the cache memory 18, the requested data block is read from the cache memory 18 and is sent to the host computer/server 12. If the front-end director 14 determines that the requested data block is not in the cache memory 18 (i.e., a so-called "cache miss") and the director 14 writes a note in the cache memory 18 (i.e., the "mail box") that it needs to receive the requested data block. The back-end directors 20 poll the cache memory 18 to determine whether there is an action to be taken (i.e., a read operation of the requested block of data). The one of the back-end directors 20 which poll the cache memory 18 mail box and detects a read operation reads the requested data block and initiates storage of such requested data block stored in the cache memory 18. When the storage is completely written into the cache memory 18, a read complete indication is placed in the "mail box" in the cache memory 18. It is to be noted that the front-end directors 14 are polling the cache memory 18 for read complete indications. When one of the polling front-end directors 14 detects a read complete indication, such front-end director 14 completes the transfer of the requested data which is now stored in the cache memory 18 to the host computer/server 12.

The use of mailboxes and polling requires time to transfer data between the host computer/server 12 and the bank 22 of disk drives thus reducing the operating bandwidth of the interface.

SUMMARY OF THE INVENTION

In accordance with one feature of the invention, a data storage system is provided for transferring data between a host computer/server and a bank of disk drives through a system interface. The system interface includes: a plurality of first directors coupled to the host computer/server; a plurality of second directors coupled to the bank of disk drives; and, a cache memory. The cache memory includes: a common memory array having a pair of redundant data/control ports; and, a pair of logic networks each one coupled to a corresponding one of the pair of data/control ports. There are separate point-to-point data paths between each one of the directors and the cache memory. A pair of the first directors are adapted for coupling to the pair of logic networks of the cache memory.

In one embodiment, each one of the first directors is on a different printed circuit board.

In accordance with another feature of the invention, a data storage system is provided for transferring data between a host computer/server and a bank of disk drives through a system interface. The system interface includes: a plurality of first directors coupled to the host computer/server; a plurality of second directors coupled to the bank of disk drives; and a cache memory. The cache memory has: a common memory array having a pair of redundant data/control ports; and a pair of logic networks each one coupled to a corresponding one of the pair of data/control ports. There are separate point-to-point data paths between each one of the directors and the global cache memory. A pair of the second directors are adapted for coupling to the pair of logic networks.

In one embodiment, each one of the pair of second directors is on a different printed circuit board.

In accordance with still another feature of the invention, a data storage system is provided for transferring data between a host computer/server and a bank of disk drives through a system interface. The interface includes: a plurality of first directors coupled to the host computer/server; a plurality of second directors coupled to the bank of disk drives; and a cache memory. The cache memory has a pair of memory boards, each memory board having a memory array. There are separate point-to-point data paths between each one of the directors and the global cache memory. One of the first directors is adapted for coupling to the memory arrays of the pair of memory boards.

In one embodiment, one of the second directors is adapted for coupling to the memory arrays of the pair of memory boards.

In one embodiment, each one of the memory boards has: a common memory array having a pair of redundant data/control ports; and, a pair of logic networks each one coupled to a corresponding one of the pair of data/control ports. The printed circuit board is wired to effect a connection with jumpers to enable a pair of the first directors to be coupled to the pair of logic networks and a pair of the second directors to be coupled to the pair of logic networks.

In one embodiment, the printed circuit board is wired to effect a connection with the jumpers to connect one of the first directors the memory arrays of a pair of the memory boards.

In one embodiment, the method includes providing each one of the directors on a different printed circuit board. The backplane is wired and connected to the jumpers to connect each one of the pair of logic networks to one of the first directors and one of the second directors.

The details of one or more embodiments of the invention are set forth in the accompanying drawings and the description below. Other features, objects, and advantages of the invention will be apparent from the description and drawings, and from the claims.

DESCRIPTION OF DRAWINGS

These and other features of the invention will become more readily apparent from the following detailed description when read together with the accompanying drawings, in which.

DETAILED DESCRIPTION

Figure 1:
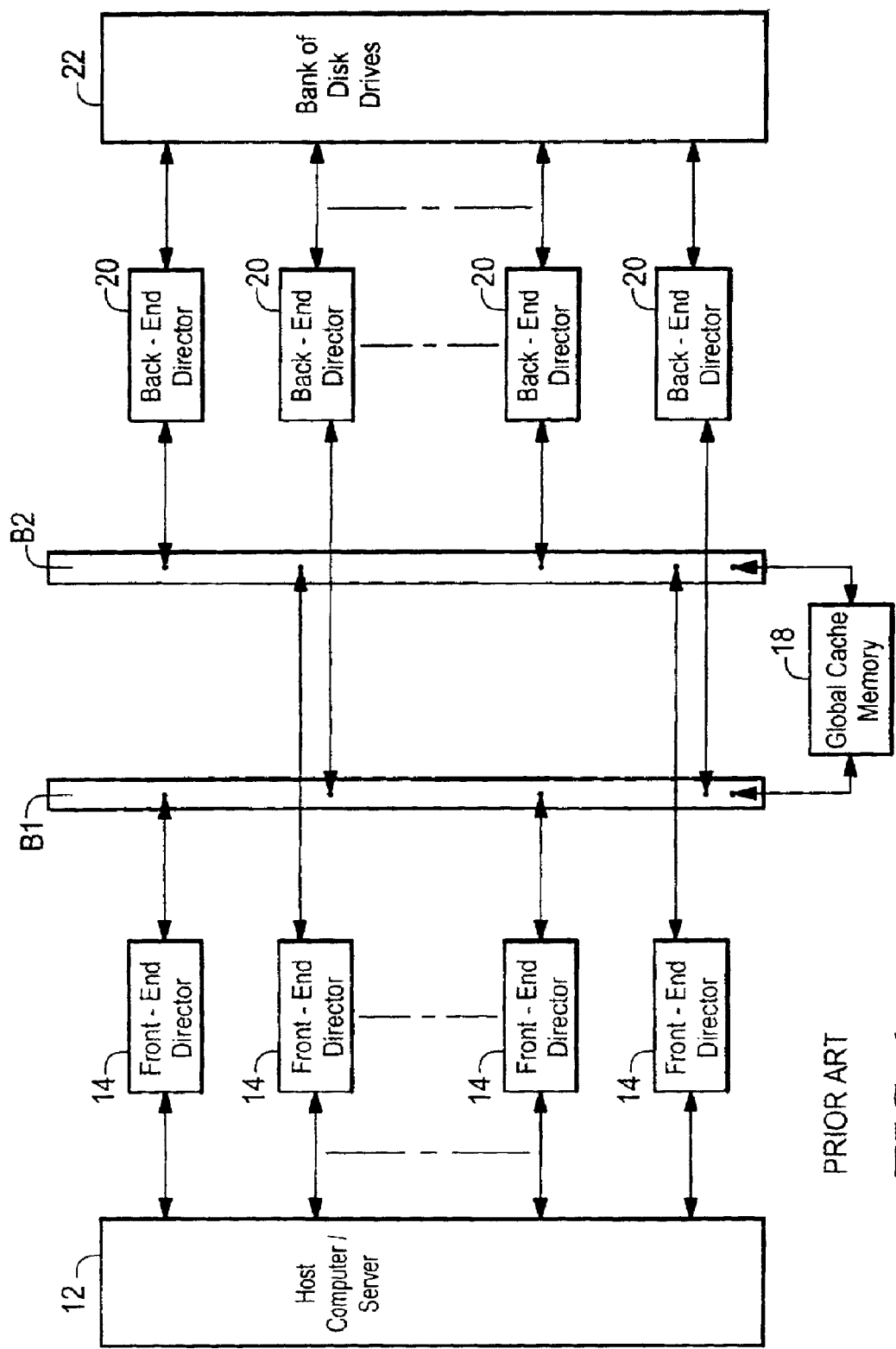
FIG. 1 is a block diagram of a data storage system according to the PRIOR ART.
Figure 2:
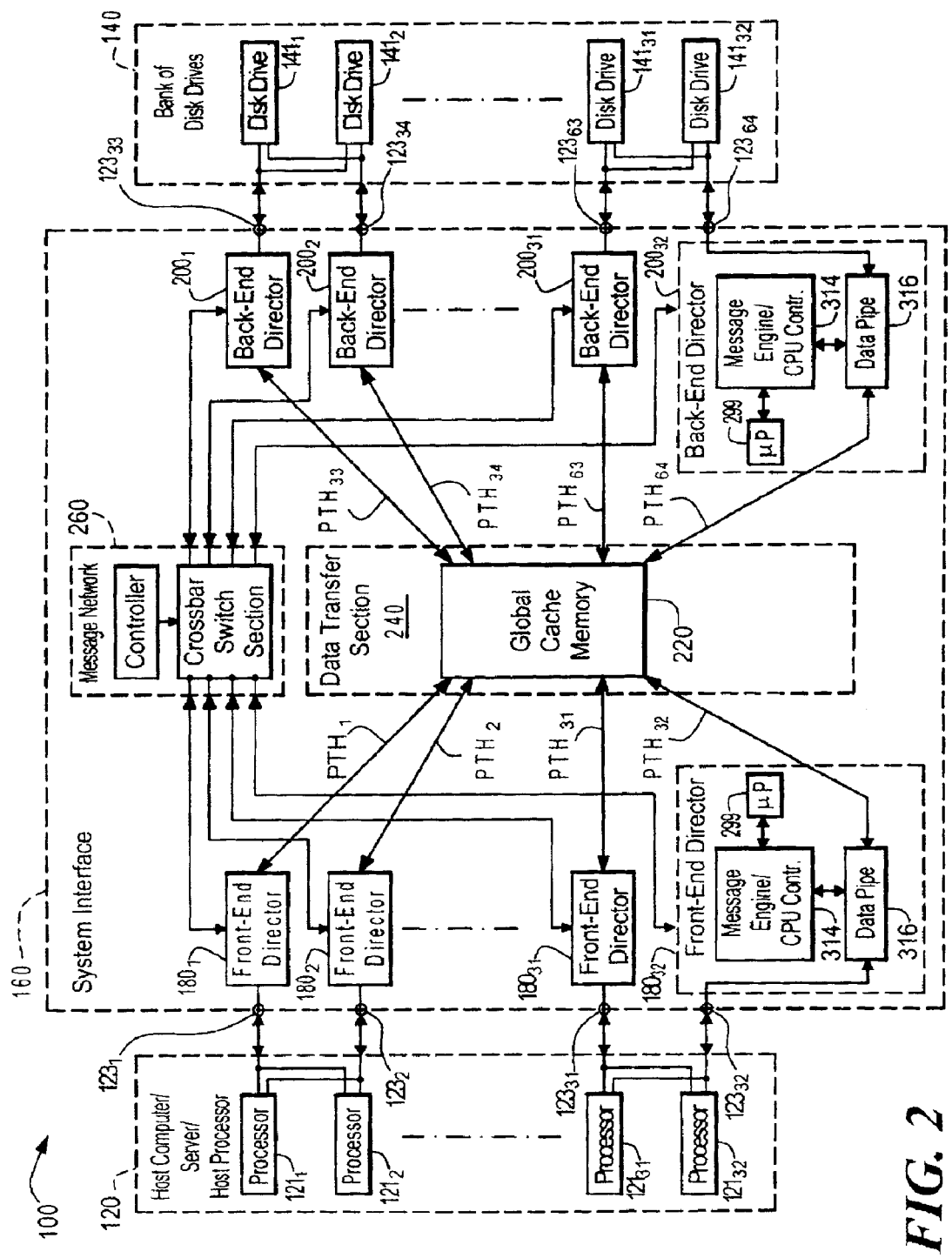
FIG. 2 is a block diagram of a data storage system according to the invention.

Referring now to FIG. 2, a data storage system 100 is shown for transferring data between a host computer/server 120 and a bank of disk drives 140 through a system interface 160. The system interface 160 includes: a plurality of, here 32 front-end directors $180_1$–$180_{32}$ coupled to the host computer/server 120 via ports $123_1$–$123_{32}$; a plurality of back-end directors $200_1$–$200_{32}$ coupled to the bank of disk drives 140 via ports $123_{33}$–$123_{64}$; a data transfer section 240, having a global cache memory 220, coupled to the plurality of front-end directors $180_1$–$180_{16}$ and the back-end directors $200_1$–$200_{16}$; and a messaging network 260, operative independently of the data transfer section 240, coupled to the plurality of front-end directors $180_1$–$180_{32}$ and the plurality of back-end directors $200_1$–$200_{32}$, as shown. The front-end and back-end directors $180_1$–$180_{32}$, $200_1$–$200_{32}$ are functionally similar and include a microprocessor ($\mu$P) 299 (i.e., a central processing unit (CPU) and RAM), a message engine/CPU controller 314 and a data pipe 316, described in detail in the co-pending patent applications referred to above. Suffice it to say here, however, that the front-end and back-end directors $180_1$–$180_{32}$, $200_1$–$200_{32}$ control data transfer between the host computer/server 120 and the bank of disk drives 140 in response to messages passing between the directors $180_1$–$180_{32}$, $200_1$–$200_{32}$ through the messaging network 260. The messages facilitate the data transfer between host computer/server 120 and the bank of disk drives 140 with such data passing through the global cache memory 220 via the data transfer section 240. More particularly, in the case of the front-end directors $180_1$–$180_{32}$, the data passes between the host computer to the global cache memory 220 through the data pipe 316 in the front-end directors $180_1$–$180_{32}$ and the messages pass through the message engine/CPU controller 314 in such front-end directors $180_1$–$180_{32}$. In the case of the back-end directors $200_1$–$200_{32}$ the data passes between the back-end directors $200_1$–$200_{32}$ and the bank of disk drives 140 and the global cache memory 220 through the data pipe 316 in the back-end directors $200_1$–$200_{32}$ and again the messages pass through the message engine/CPU controller 314 in such back-end director $200_1$–$200_{32}$.

With such an arrangement, the cache memory 220 in the data transfer section 240 is not burdened with the task of transferring the director messaging. Rather the messaging network 260 operates independent of the data transfer section 240 thereby increasing the operating bandwidth of the system interface 160.

In operation, and considering first a read request by the host computer/server 120 (i.e., the host computer/server 120 requests data from the bank of disk drives 140), the request is passed from one of a plurality of, here 32, host computer processors $121_1$–$121_{32}$ in the host computer 120 to one or more of the pair of the front-end directors $180_1$–$180_{32}$ connected to such host computer processor $121_1$–$121_{32}$. (It is noted that in the host computer 120, each one of the host computer processors $121_1$–$121_{32}$ is coupled to here a pair (but not limited to a pair) of the front-end directors $180_1$–$180_{32}$, to provide redundancy in the event of a failure in one of the front end-directors $181_1$–$181_{32}$ coupled thereto. Likewise, the bank of disk drives 140 has a plurality of, here 32, disk drives $141_1$–$141_{32}$, each disk drive $141_1$–$141_{32}$ being coupled to here a pair (but not limited to a pair) of the back-end directors $200_1$–$200_{32}$, to provide redundancy in the event of a failure in one of the back-end directors $200_1$–$200_{32}$ coupled thereto). Thus, front-end director pairs $180_1$, $180_2$; . . . $180_{31}$, $180_{32}$ are coupled to processor pairs $121_1$, $121_2$; . . . $121_{31}$, $121_{32}$, respectively, as shown. Likewise, back-end director pairs $200_1$, $200_2$; . . . $200_{31}$, $200_{32}$ are coupled to disk drive pairs $141_1$, $141_2$; . . . $141_{31}$, $141_{32}$, respectively, as shown.

Each front-end director $180_1$–$180_{32}$ includes a microprocessor ($\mu$P) 299 (i.e., a central processing unit (CPU) and RAM) described in detail in the referenced patent application. Suffice it to say here, however, that the microprocessor 299 makes a request for the data from the global cache memory 220. The global cache memory 220 has a resident cache management table, not shown. Every director $180_1$–$180_{32}$, $200_1$–$200_{32}$ has access to the resident cache management table and every time a front-end director $180_1$–$180_{32}$ requests a data transfer, the front-end director $180_1$–$180_{32}$ must query the global cache memory 220 to determine whether the requested data is in the global cache memory 220. If the requested data is in the global cache memory 220 (i.e., a read "hit"), the front-end director $180_1$–$180_{32}$, more particularly the microprocessor 299 therein, mediates a DMA (Direct Memory Access) operation for the global cache memory 220 and the requested data is transferred to the requesting host computer processor $121_1$–$121_{32}$.

If, on the other hand, the front-end director $180_1$–$180_{32}$ receiving the data request determines that the requested data is not in the global cache memory 220 (i.e., a "miss") as a result of a query of the cache management table in the global cache memory 220, such front-end director $180_1$–$180_{32}$ concludes that the requested data is in the bank of disk drives 140. Thus the front-end director $180_1$–$180_{32}$ that received the request for the data must make a request for the data from one of the back-end directors $200_1$–$200_{32}$ in order for such back-end director $200_1$–$200_{32}$ to request the data from the bank of disk drives 140. The mapping of which back-end directors $200_1$–$200_{32}$ control which disk drives $141_1$–$141_{32}$ in the bank of disk drives 140 is determined during a power-up initialization phase. The map is stored in the global cache memory 220. Thus, when the front-end director $180_1$–$180_{32}$ makes a request for data from the global cache memory 220 and determines that the requested data is not in the global cache memory 220 (i.e., a "miss"), the front-end director $180_1$–$180_{32}$ is also advised by the map in the global cache memory 220 of the back-end director $200_1$–$200_{32}$ responsible for the requested data in the bank of disk drives 140. The requesting front-end director $180_1$–$180_{32}$ then must make a request for the data in the bank of disk drives 140 from the map designated back-end director $200_1$–$200_{32}$. This request between the front-end director $180_1$–$180_{32}$ and the appropriate one of the back-end directors $200_1$–$200_{32}$ (as determined by the map stored in the global cache memory 200) is by a message which passes from the front-end director $180_1$–$180_{32}$ through the message network 260 to the appropriate back-end director $200_1$–$200_{32}$. It is noted then that the message does not pass through the global cache memory 220 (i.e., does not pass through the data transfer section 240) but rather passes through the separate, independent message network 260. Thus, communication between the directors $180_1$–$180_{32}$, $200_1$–$200_{32}$ is through the message network 260 and not through the global cache memory 220. Consequently, valuable bandwidth for the global cache memory 220 is not used for messaging among the directors $180_1$–$180_{32}$, $200_1$–$200_{32}$.

Thus, on a global cache memory 220 "read miss", the front-end director $180_1$–$180_{32}$ sends a message to the appropriate one of the back-end directors $200_1$–$200_{32}$ through the message network 260 to instruct such back-end director $200_1$–$200_{32}$ to transfer the requested data from the bank of disk drives 140 to the global cache memory 220. When accomplished, the back-end director $200_1$–$200_{32}$ advises the requesting front-end director $180_1$–$180_{32}$ that the transfer is accomplished by a message, which passes from the back-end director $200_1$–$200_{32}$ to the front-end director $180_1$–$180_{32}$ through the message network 260. In response to the acknowledgement signal, the front-end director $180_1$–$180_{32}$ is thereby advised that such front-end director $180_1$–$180_{32}$ can transfer the data from the global cache memory 220 to the requesting host computer processor $121_1$–$121_{32}$ as described above when there is a cache "read hit".

It should be noted that there might be one or more back-end directors $200_1$–$200_{32}$ responsible for the requested data. Thus, if only one back-end director $200_1$–$200_{32}$ is responsible for the requested data, the requesting front-end director $180_1$–$180_{32}$ sends a uni-cast message via the message network 260 to only that specific one of the back-end directors $200_1$–$200_{32}$. On the other hand, if more than one of the back-end directors $200_1$–$200_{32}$ is responsible for the requested data, a multi-cast message (here implemented as a series of uni-cast messages) is sent by the requesting one of the front-end directors $180_1$–$180_{32}$ to all of the back-end directors $200_1$–$200_{32}$ having responsibility for the requested data. In any event, with both a uni-cast or multi-cast message, such message is passed through the message network 260 and not through the data transfer section 240 (i.e., not through the global cache memory 220).

Likewise, it should be noted that while one of the host computer processors $121_1$–$121_{32}$ might request data, the acknowledgement signal may be sent to the requesting host computer processor $121_1$ or one or more other host computer processors $121_1$–$121_{32}$ via a multi-cast (i.e., sequence of uni-cast) messages through the message network 260 to complete the data read operation.

Considering a write operation, the host computer 120 wishes to write data into storage (i.e., into the bank of disk drives 140). One of the front-end directors $180_1$–$180_{32}$ receives the data from the host computer 120 and writes it into the global cache memory 220. The front-end director $180_1$–$180_{32}$ then requests the transfer of such data after some period of time when the back-end director $200_1$–$200_{32}$ determines that the data can be removed from such cache memory 220 and stored in the bank of disk drives 140. Before the transfer to the bank of disk drives 140, the data in the cache memory 220 is tagged with a bit as "fresh data" (i.e., data which has not been transferred to the bank of disk drives 140, that is data which is "write pending"). Thus, if there are multiple write requests for the same memory location in the global cache memory 220 (e.g., a particular bank account) before being transferred to the bank of disk drives 140, the data is overwritten in the cache memory 220 with the most recent data. Each time data is transferred to the global cache memory 220, the front-end director $180_1$–$180_{32}$ controlling the transfer also informs the host computer 120 that the transfer is complete to thereby free-up the host computer 120 for other data transfers. When it is time to transfer the data in the global cache memory 220 to the bank of disk drives 140, as determined by the back-end director $200_1$–$200_{32}$, the back-end director $200_1$–$200_{32}$ transfers the data from the global cache memory 220 to the bank of disk drives 140 and resets the tag associated with data in the global cache memory 220 (i.e., un-tags the data) to indicate that the data in the global cache memory 220 has been transferred to the bank of disk drives 140. It is noted that the un-tagged data in the global cache memory 220 remains there until overwritten with new data.

Figure 3:
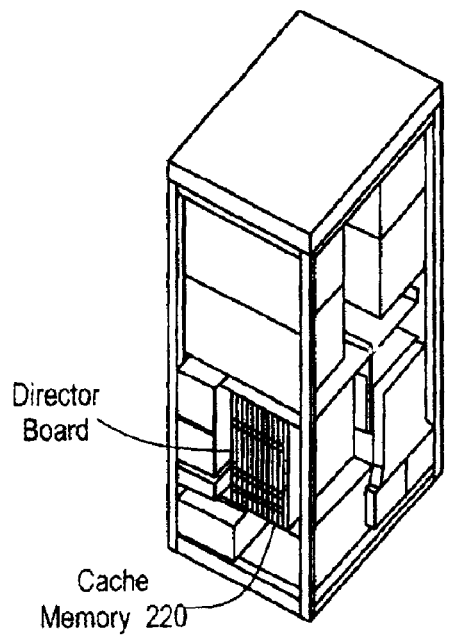
FIG. 3 is a sketch of an electrical cabinet storing a system interface used in the data storage system of FIG. 2.
Figure 4:
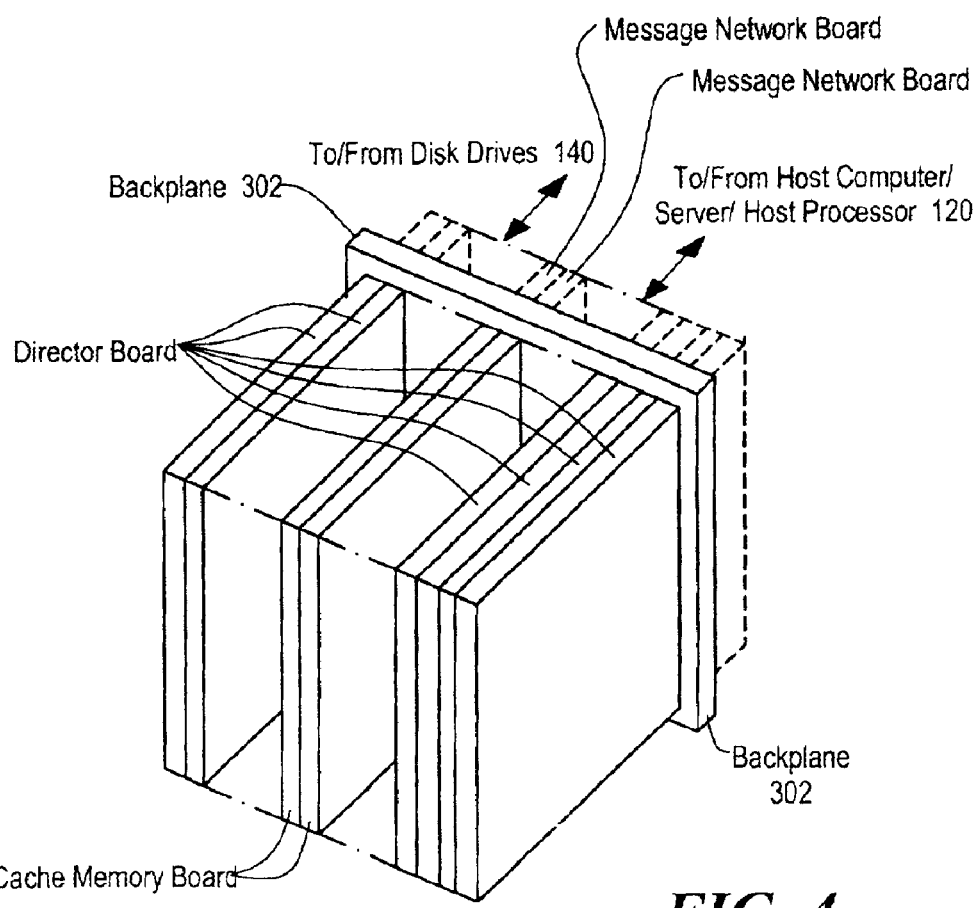
FIG. 4 is a diagramatical, isometric sketch showing printed circuit boards providing the system interface of the data storage system of FIG. 2.
Figure 5:
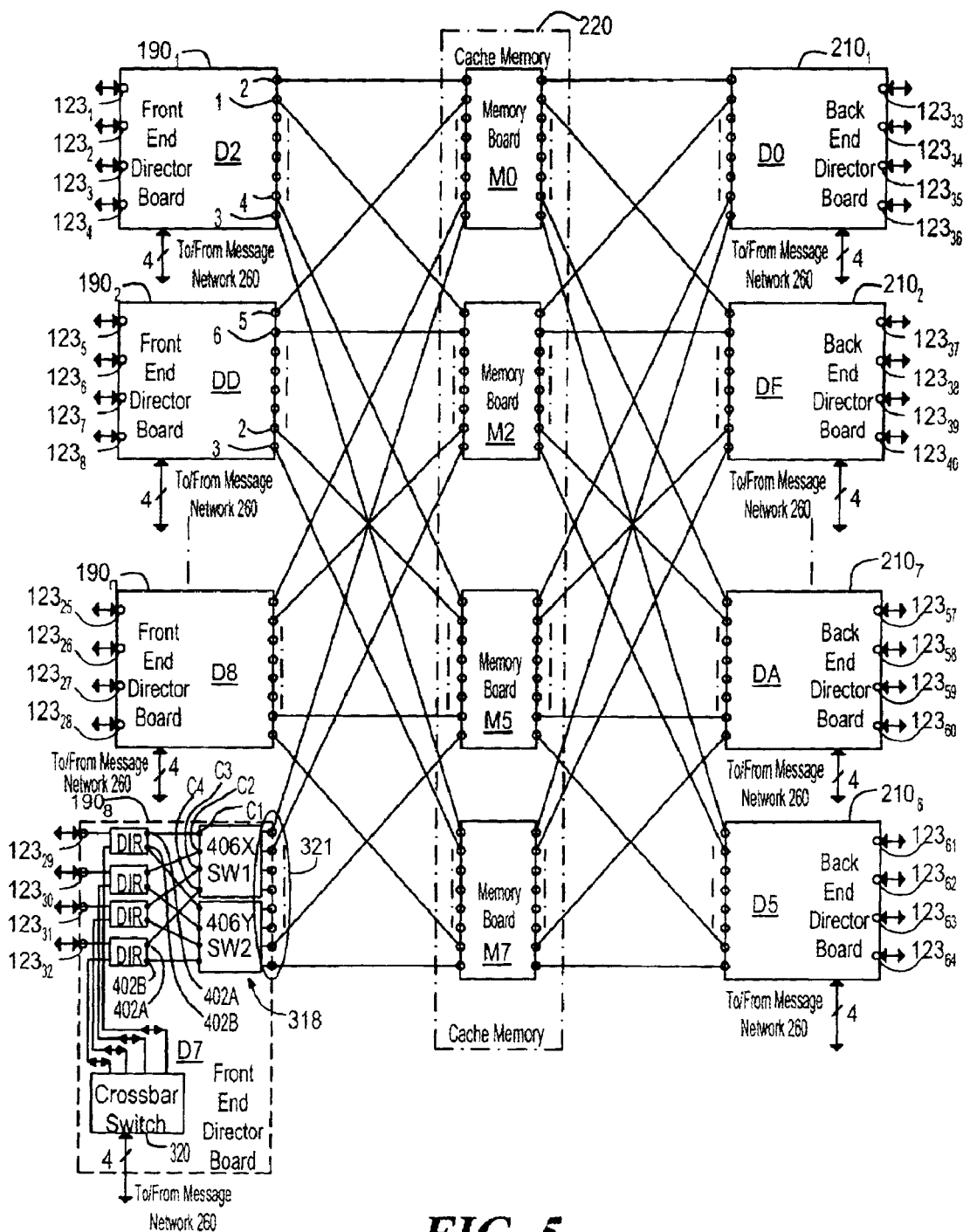
FIG. 5 is a block diagram of the system interface used in the data storage system of FIG. 2.

Referring now to FIGS. 3, 4, and 5, the system interface 160 is shown to include an electrical cabinet 300 having stored therein: a plurality of, here eight front-end director boards $190_1$–$190_8$, each one having here four of the front-end directors $180_1$–$180_{32}$; a plurality of, here eight back-end director boards $210_1$–$210_8$, each one having here four of the back-end directors $200_1$–$200_{32}$; and a plurality of, here eight, memory boards M0–M7 which together make up the global cache memory 220. These boards plug into the front side of a backplane 302. (It is noted that the backplane 302 is a mid-plane printed circuit board). Plugged into the backside of the backplane 302 are message network boards which together make up the message network 260 as described in the co-pending patent applications referred to above. The backside of the backplane 302 has plugged into it adapter boards, not shown in FIGS. 2–4, which couple the boards plugged into the back-side of the backplane 302 with the computer 120 and the bank of disk drives 140 as shown in FIG. 2.

That is, referring again briefly to FIG. 2, an I/O adapter, not shown, is coupled between each one of the front-end (FE) directors $180_1$–$180_{32}$ and the host computer 120 and an I/O adapter, not shown, is coupled between each one of the back-end (BE) directors $200_1$–$200_{32}$ and the bank of disk drives 140.

Referring now to FIG. 5, and as described in more in the co-pending patent applications referred to above, each one of the director boards $190_1$–$210_8$ includes, as noted above four of the directors $180_1$–$180_{32}$, $200_1$–$200_{32}$ (FIG. 2). It is noted that the director boards $190_1$–$190_8$ having four front-end directors per board, $180_1$–$180_{32}$ are referred to as front-end directors and the director boards $210_1$–$210_8$ having four back-end directors per board, $200_1$–$200_{32}$ are referred to as back-end directors. Each one of the directors $180_1$–$180_{32}$, $200_1$–$200_{32}$ includes the microprocessor 299 referred to above), the message engine/CPU controller 314, and the data pipe 316 shown in FIG. 2.

The front-end director boards have ports $123_1$–$123_{32}$, as shown in FIG. 2, coupled to the processors $121_1$–$121_{32}$, as shown. The back-end director boards have ports $123_{33}$–$123_{64}$, as shown in FIG. 2, coupled to the disk drives $141_1$–$141_{32}$, as shown.

Each one of the director boards $190_1$–$210_8$ includes a crossbar switch 318 as shown in FIG. 5. The crossbar switch 318 has four input/output ports $C_1$–$C_4$, each one being coupled to the data pipe 316 (FIG. 2) of a corresponding one of the four directors $180_1$–$180_{32}$, $200_1$–$200_{32}$ on the director board $190_1$–$210_8$. The crossbar switch 318 has eight output/input ports collectively identified in FIG. 5 by numerical designation 321 (which plug into the backplane 302). The crossbar switch 318 on the front-end director boards $191_1$–$191_8$ is used for coupling the data pipe 316 of a selected one of the four front-end directors $180_1$–$180_{32}$ on the front-end director board $190_1$–$190_8$ to the global cache memory 220 via the backplane 302 and I/O adapter, not shown. The crossbar switch 318 on the back-end director boards $210_1$–$210_8$ is used for coupling the data pipe 316 of a selected one of the four back-end directors $200_1$–$200_{32}$ on the back-end director board $210_1$–$210_8$ to the global cache memory 220 via the backplane 302 and I/O adapter, not shown. Thus, referring to FIG. 2, the data pipe 316 in the front-end directors $180_1$–$180_{32}$ couples data between the host computer 120 and the global cache memory 220 while the data pipe 316 in the back-end directors $200_1$–$200_{32}$ couples data between the bank of disk drives 140 and the global cache memory 220. It is noted that there are separate point-to-point data paths $PTH_1$–$PTH_{64}$ (FIG. 2) between each one of the directors $180_1$–$180_{32}$, $200_1$–$200_{32}$ and the global cache memory 220. It is also noted that the backplane 302 is a passive backplane because it is made up of only etched conductors on one or more layers of a printed circuit board. That is, the backplane 302 does not have any active components.

Further, as described in the co-pending patent applications referred to above, crossbar switch 320 (FIG. 5) plugs into the backplane 302 and is used for coupling to the directors to the message network 260 (FIG. 2) through the backplane.

Referring again to FIG. 5, the crossbar switch 318 includes a pair of crossbar switches 406X, 406Y. Each one of the switches 406X, 406Y includes four input/output director-side ports $C_1$–$C_4$ and the four input/output memory-side ports collectively designated in FIG. 5 by numerical designation 321. The director-side ports $C_1$–$C_4$ of switch 406X are connected to the four directors on the director board, as indicated, and as described in more detail in the co-pending patent applications referred to above. Likewise, director-side ports $C_1$–$C_4$ of switch 406Y are also connected to the dual-ported directors on such board, as indicated. Thus, as described in the co-pending patent applications referred to above, each director is a dual-ported directors.

Figure 8:
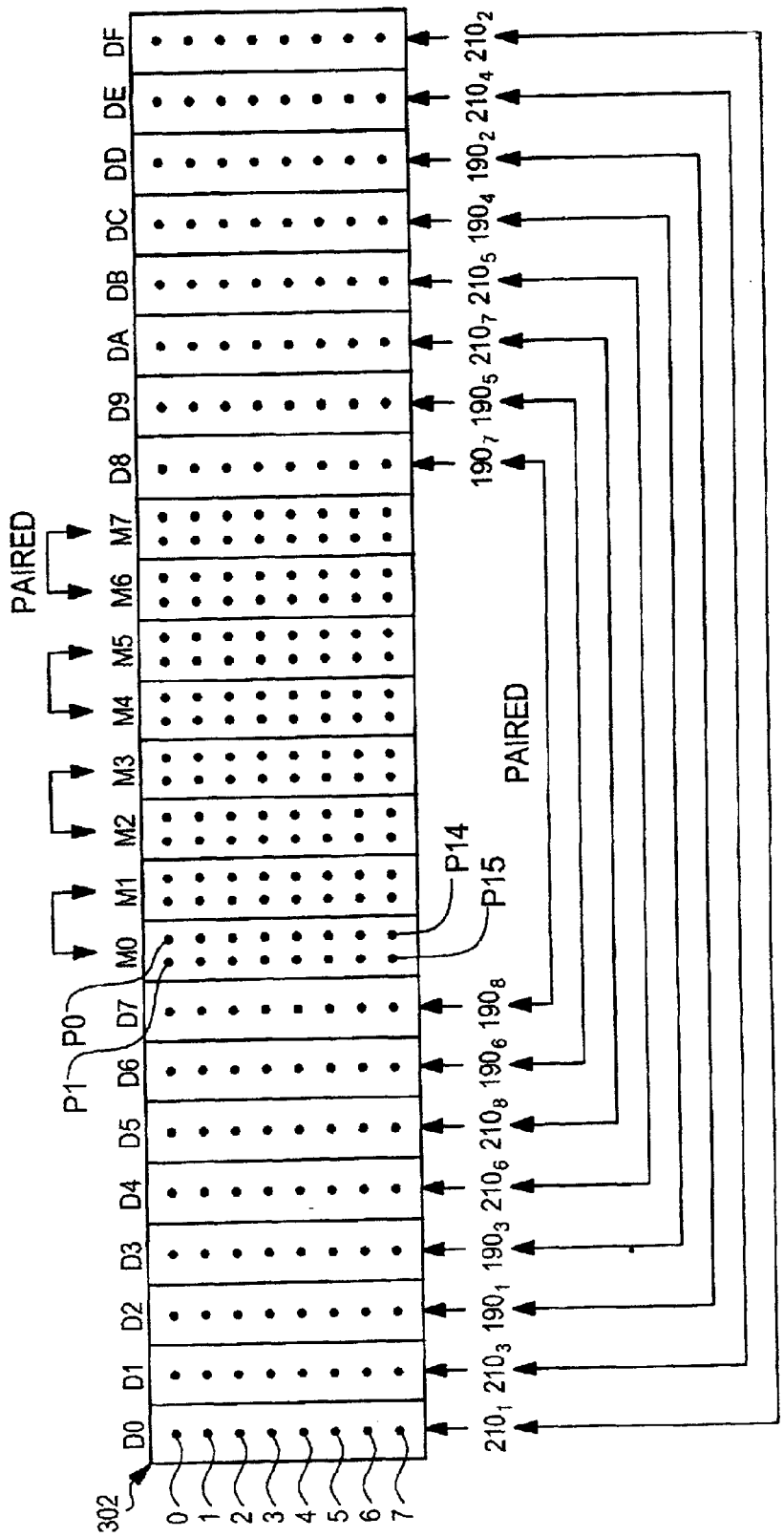
FIG. 8 is an elevation view of a backplane used in the system of FIG. 2, such backplane having slots adapted to receive front-end director printed circuit boards, back-end director printed circuit boards and memory boards.

Each one of the ports $C_1$–$C_4$ may be coupled to a selected one of the four ports collectively designated by 321 in accordance with control words provided to the switch 406X by the directors on such board, respectively, as described in the above-referenced patent application. Suffice it to say here, that port 402A of any one of the directors $180_1$, $180_3$, $180_5$, $180_7$ may be coupled to any one of the ports 321 of switch 406X, selectively in accordance with the control words. The coupling between the director boards $190_1$–$190_8$, $210_1$–$210_8$ and the global cache memory 220 is shown in FIG. 8. Likewise for switch 406Y.

More particularly, and referring also to FIG. 2, as noted above, each one of the host computer processors $121_1$–$121_{32}$ in the host computer 120 is coupled to a pair of the front-end directors $180_1$–$180_{32}$, to provide redundancy in the event of a failure in one of the front end-directors $181_1$–$181_{32}$ coupled thereto. Likewise, the bank of disk drives 140 has a plurality of, here 32, disk drives $141_1$–$141_{32}$, each disk drive $141_1$–$141_{32}$ being coupled to a pair of the back-end directors $200_1$–$200_{32}$, to provide redundancy in the event of a failure in one of the back-end directors $200_1$–$200_{32}$ coupled thereto). Thus, considering exemplary host computer processor $121_1$, such processor $121_1$ is coupled to a pair of front-end directors $180_1$, $180_2$. Thus, if director $180_1$ fails, the host computer processor $121_1$ can still access the system interface 160, albeit by the other front-end director $180_2$. Thus, directors $180_1$ and $180_2$ are considered redundancy pairs of directors. Likewise, other redundancy pairs of front-end directors are: front-end directors $180_3$, $180_4$; $180_5$, $180_6$; $180_7$, $180_8$; $180_9$, $180_{10}$; $180_{11}$, $180_{12}$; $180_{13}$, $180_{14}$; $180_{15}$, $180_{16}$; $180_{17}$, $180_{18}$, $180_{19}$, $180_{20}$; $180_{21}$, $180_{22}$; $180_{23}$, $180_{24}$, $180_{25}$, $180_{26}$; $180_{27}$, $180_{28}$; $180_{29}$, $180_{30}$; and $180_{31}$, $180_{32}$ (only directors $180_{31}$ and $180_{32}$ being shown in FIG. 2).

Likewise, disk drive $141_1$ is coupled to a pair of back-end directors $200_1$, $200_2$. Thus, if director $200_1$ fails, the disk drive $141_1$ can still access the system interface 160, albeit by the other back-end director $180_2$. Thus, directors $200_1$ and $200_2$ are considered redundancy pairs of directors. Likewise, other redundancy pairs of back-end directors are: back-end directors $200_3$, $200_4$; $200_5$, $200_6$, $200_7$, $200_8$, $200_9$, $200_{10}$; $200_{11}$, $200_{12}$; $200_{13}$, $200_{14}$, $200_{15}$, $200_{16}$, $200_{17}$, $200_{18}$, $200_{19}$, $200_{20}$; $200_{21}$, $200_{22}$; $200_{23}$, $200_{24}$; $200_{25}$, $200_{26}$; $200_{27}$, $200_{28}$; $200_{29}$, $200_{30}$; and $200_{31}$, $200_{32}$ (only directors $200_{31}$ and $200_{32}$ being shown in FIG. 2).

As noted above, there are four directors on each one of the director boards. The physical position of the director boards along with a positional designation, are shown in FIG. 8 (e.g., director board $190_1$ also has the designation D2). Further, Thus, referring to FIGS. 2 and 5:

| FRONT-END DIRECTOR BOARD | FRONT-END DIRECTORS ON THE FRONT-END DIRECTOR BOARD |
| --- | --- |
| $190_1$ (D2) | $180_1$, $180_3$, $180_5$, $180_7$ |
| $190_1$ (DD) | $180_2$, $180_4$, $180_6$, $180_8$ |
| $190_2$ (D3) | $180_9$, $180_{11}$, $180_{13}$, $180_{15}$ |
| $190_3$ (DC) | $180_{10}$, $180_{12}$, $180_{14}$, $180_{16}$ |
| $190_4$ (D9) | $180_{17}$, $180_{19}$, $180_{21}$, $180_{23}$ |
| $190_5$ (D6) | $180_{18}$, $180_{20}$, $180_{22}$, $180_{24}$ |
| $190_6$ (D8) | $180_{25}$, $180_{27}$, $180_{29}$, $180_{31}$ |
| $190_7$ (D7) | $180_{26}$, $180_{28}$, $180_{30}$, $180_{32}$ |
| $210_1$ (D0) | $200_1$, $200_3$, $200_5$, $200_7$ |
| $210_1$ (DF) | $200_2$, $200_4$, $200_6$, $200_8$ |
| $210_2$ (D2) | $200_9$, $200_{11}$, $200_{13}$, $200_{15}$ |
| $210_3$ (DE) | $200_{10}$, $200_{12}$, $200_{14}$, $200_{16}$ |
| $210_4$ (DB) | $200_{17}$, $200_{19}$, $200_{21}$, $200_{23}$ |
| $210_5$ (D4) | $200_{18}$, $200_{20}$, $200_{22}$, $200_{24}$ |
| $210_6$ (DA) | $200_{25}$, $200_{27}$, $200_{29}$, $200_{31}$ |
| $210_7$ (D5) | $200_{26}$, $200_{28}$, $200_{30}$, $200_{32}$ |

Thus, to provide the redundant pairs of directors described above, the following director boards are paired to enable achievement of the above-described redundancy:

Front-end boards:

D2 and DD

D3 and DC

D9 and D6

D8 and D7

Back-end boards

D0 and DF

D2 and DE

DB and D4

DA and D5

Further, referring also to FIG. 5, the global cache memory 220 includes a plurality of, here eight, cache memory boards M0–M7, as shown. Still further, referring to FIG. 6, an exemplary one of the cache memory boards is shown. Here, each cache memory board includes four memory array regions 1–4, an exemplary one thereof being shown and described in connection with FIG. 6 of U.S. Pat. No. 5,943,287 entitled "Fault Tolerant Memory System", John K. Walton, inventor, issued Aug. 24, 1999 and assigned to the same assignee as the present invention, the entire subject matter therein being incorporated herein by reference. Further detail of the exemplary one of the cache memory boards is described in the co-pending patent applications referred to above.

Figure 6:
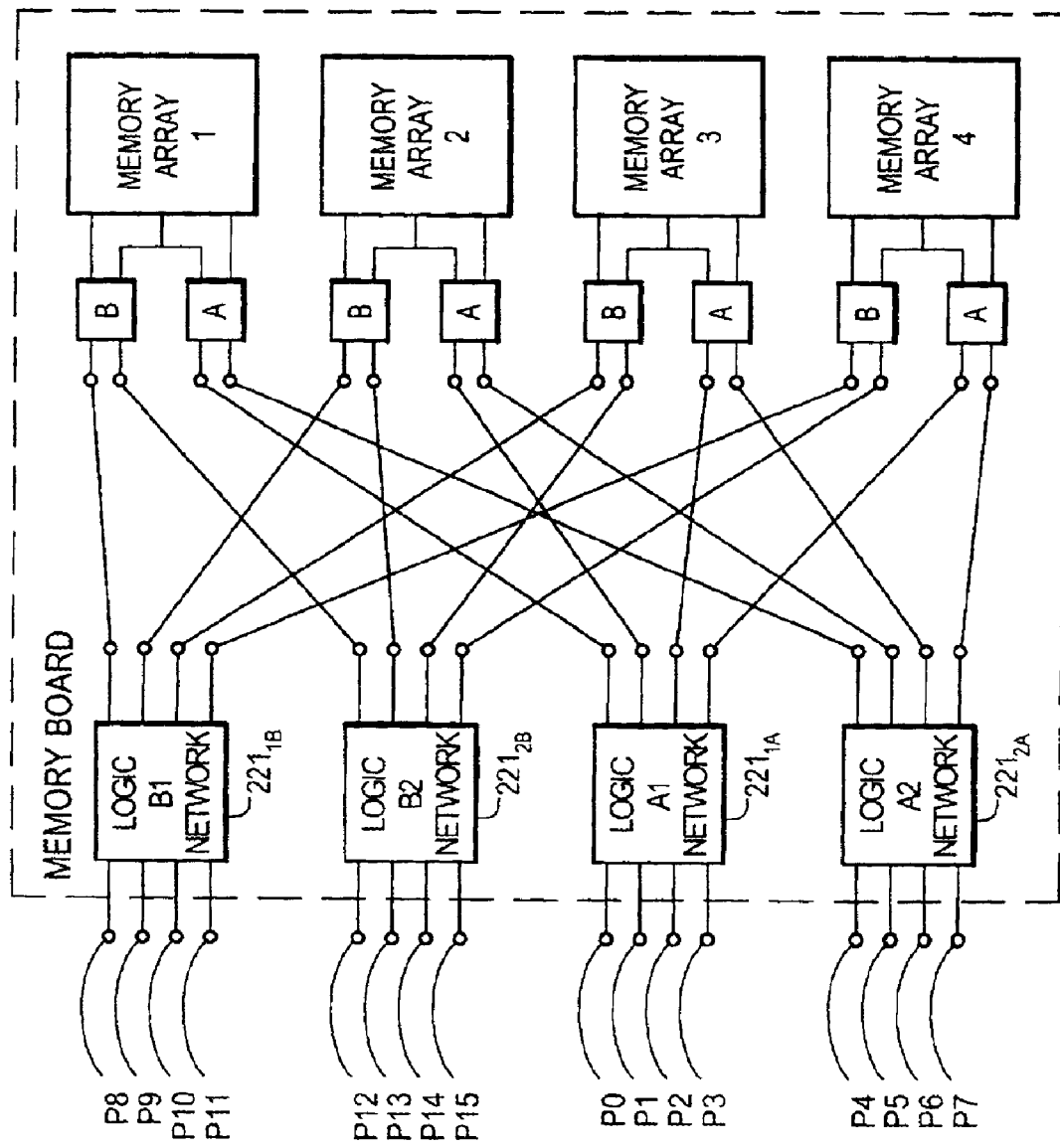
FIG. 6 is a diagram of an exemplary global cache memory board used in the system interface of FIG. 2.

As shown in FIG. 6, the exemplary memory board includes a plurality of, here four RAM memory array regions 1–4, each one of the array regions has a pair of redundant data/control ports, i.e., an A port and a B port, for receiving data to, or from, the memory array region as well as for receiving memory control signals. The memory board itself has sixteen ports; a set of eight domain A ports $P_0$–$P_7$ and a set of eight domain B ports $P_8$–$P_{15}$. As described in more detail in the co-pending patent applications referred to above and in the above-reference U.S. Patent, each memory board has four logic networks (here crossbar switches). These four logic networks $221_{1A}$, $221_{2A}$, $221_{1B}$, $221_{2B}$, are here cross bar switches. Logic networks $221_{1A}$, $221_{2A}$, and logic networks $221_{1B}$, $221_{2B}$, are in two independent domains, i.e., domain A and domain B. Thus, logic networks $221_{1A}$, $221_{2A}$, are in domain A and logic networks $221_{1B}$, $221_{2B}$ are in domain B, respectively. Further, logic networks $221_{1A}$, $221_{2A}$, in domain A are designated as A1 and A2 respectively, and logic networks $221_{1B}$, $221_{2B}$ in domain B are designated as B1 and B2, respectively.

These connections between memory boards M0 through M7 and directors D0 through DF are in the following Tables I and II, respectively:

TABLE I

| PORT | LOGIC | DIRECTOR (END), PORT, SWITCH |
|---|---|---|
| MEMORY 0 | | |
| $P_0$ | A1 | D8 (FE), Port 0, Switch 406X |
| $P_1$ | A1 | D0 (BE), Port 0, Switch 406X |
| $P_2$ | A1 | D9 (FE), Port 1, Switch 406X |
| $P_3$ | A1 | D1 (BE), Port 1, Switch 406X |
| $P_4$ | A2 | DA (BE), Port 2, Switch 406X |
| $P_5$ | A2 | D2 (FE), Port 2, Switch 406X |
| $P_6$ | A2 | DB (BE), Port 3, Switch 406X |
| $P_7$ | A2 | D3 (FE), Port 3, Switch 406X |
| $P_8$ | B1 | DC (FE), Port 4, Switch 406Y |
| $P_9$ | B1 | D4 (BE), Port 4, Switch 406Y |
| $P_{10}$ | B1 | DD (FE), Port 5, Switch 406Y |

TABLE I-continued

| PORT | LOGIC | |
|---|---|---|
| $P_{11}$ | B1 | D5 (BE), Port 5, Switch 406Y |
| $P_{12}$ | B2 | DE (BE), Port 6, Switch 406Y |
| $P_{13}$ | B2 | D6 (FE), Port 6, Switch 406Y |
| $P_{14}$ | B2 | DF (BE), Port 7, Switch 406Y |
| $P_{15}$ | B2 | D7 (FE), Port 7, Switch 406Y |
| MEMORY 1 | | |
| | | DIRECTOR, PORT, SWITCH |
| $P_0$ | A1 | DC (FE), Port 0, Switch 406X |
| $P_1$ | A1 | D4 (BE), Port 0, Switch 406X |
| $P_2$ | A1 | DD (FE), Port 1, Switch 406X |
| $P_3$ | A1 | D5 (BE), Port 1, Switch 406X |
| $P_4$ | A2 | DE (BE), Port 2, Switch 406X |
| $P_5$ | A2 | D6 (FE), Port 2, Switch 406X |
| $P_6$ | A2 | DF (BE), Port 3, Switch 406X |
| $P_7$ | A2 | D7 (FE), Port 3, Switch 406X |
| $P_8$ | B1 | D8 (FE), Port 4, Switch 406Y |
| $P_9$ | B1 | D0 (BE), Port 4, Switch 406Y |
| $P_{10}$ | B1 | D9 (FE), Port 5, Switch 406Y |
| $P_{11}$ | B1 | D1 (BE), Port 5, Switch 406Y |
| $P_{12}$ | B2 | DA (BE), Port 6, Switch 406Y |
| $P_{13}$ | B2 | D2 (FE), Port 6, Switch 406Y |
| $P_{14}$ | B2 | DB (BE), Port 7, Switch 406Y |
| $P_{15}$ | B2 | D3 (FE), Port 7, Switch 406Y |
| MEMORY 2 | | |
| | | DIRECTOR, PORT, SWITCH |
| $P_0$ | A1 | DF (BE), Port 0, Switch 406X |
| $P_1$ | A1 | D1 (BE), Port 0, Switch 406X |
| $P_2$ | A1 | D8 (FE), Port 1, Switch 406X |
| $P_3$ | A1 | D2 (FE), Port 1, Switch 406X |
| $P_4$ | A2 | D9 (FE), Port 2, Switch 406X |
| $P_5$ | A2 | D3 (FE), Port 2, Switch 406X |
| $P_6$ | A2 | DA (BE), Port 3, Switch 406X |
| $P_7$ | A2 | D4 (BE), Port 3, Switch 406X |
| $P_8$ | B1 | DB (BE), Port 4, Switch 406Y |
| $P_9$ | B1 | D5 (BE), Port 4, Switch 406Y |
| $P_{10}$ | B1 | DC (FE), Port 5, Switch 406Y |
| $P_{11}$ | B1 | D6 (FE), Port 5, Switch 406Y |
| $P_{12}$ | B2 | DD (FE), Port 6, Switch 406Y |
| $P_{13}$ | B2 | D7 (FE), Port 6, Switch 406Y |
| $P_{14}$ | B2 | DE (BE), Port 7, Switch 406Y |
| $P_{15}$ | B2 | D0 (BE), Port 7, Switch 406Y |
| MEMORY 3 | | |
| | | DIRECTOR, PORT, SWITCH |
| $P_0$ | A1 | DB (BE), Port 0, Switch 406X |
| $P_1$ | A1 | D5 (BE), Port 0, Switch 406X |
| $P_2$ | A1 | DC (FE), Port 1, Switch 406X |
| $P_3$ | A1 | D6 (FE), Port 1, Switch 406X |
| $P_4$ | A2 | DD (FE), Port 2, Switch 406X |
| $P_5$ | A2 | D7 (FE), Port 2, Switch 406X |
| $P_6$ | A2 | DE (BE), Port 3, Switch 406X |
| $P_7$ | A2 | D0 (BE), Port 3, Switch 406X |
| $P_8$ | B1 | DF (BE), Port 4, Switch 406Y |
| $P_9$ | B1 | D1 (BE), Port 4, Switch 406Y |
| $P_{10}$ | B1 | D8 (FE), Port 5, Switch 406Y |
| $P_{11}$ | B1 | D2 (FE), Port 5, Switch 406Y |
| $P_{12}$ | B2 | D9 (FE), Port 6, Switch 406Y |
| $P_{13}$ | B2 | D3 (FE), Port 6, Switch 406Y |
| $P_{14}$ | B2 | DA (BE), Port 7, Switch 406Y |
| $P_{15}$ | B2 | D4 (BE), Port 7, Switch 406Y |
| MEMORY 4 | | |
| | | DIRECTOR, PORT, SWITCH |
| $P_0$ | A1 | DE (BE), Port 0, Switch 406X |
| $P_1$ | A1 | D2 (FE), Port 0, Switch 406X |
| $P_2$ | A1 | DF (BE), Port 1, Switch 406X |
| $P_3$ | A1 | D3 (FE), Port 1, Switch 406X |
| $P_4$ | A2 | D8 (FE), Port 2, Switch 406X |
| $P_5$ | A2 | D4 (BE), Port 2, Switch 406X |
| $P_6$ | A2 | D9 (FE), Port 3, Switch 406X |
| $P_7$ | A2 | D5 (BE), Port 3, Switch 406X |

TABLE I-continued

| PORT | LOGIC | |
|---|---|---|
| $P_8$ | B1 | DA (BE), Port 4, Switch 406Y |
| $P_9$ | B1 | D6 (FE), Port 4, Switch 406Y |
| $P_{10}$ | B1 | DB (BE), Port 5, Switch 406Y |
| $P_{11}$ | B1 | D7 (FE), Port 5, Switch 406Y |
| $P_{12}$ | B2 | DC (FE), Port 6, Switch 406Y |
| $P_{13}$ | B2 | D0 (BE), Port 6, Switch 406Y |
| $P_{14}$ | B2 | DD (FE), Port 7, Switch 406Y |
| $P_{15}$ | B2 | D1 (BE), Port 7, Switch 406Y |
| MEMORY 5 | | |
| | | DIRECTOR, PORT, SWITCH |
| $P_0$ | A1 | DA (BE), Port 0, Switch 406X |
| $P_1$ | A1 | D6 (FE), Port 0, Switch 406X |
| $P_2$ | A1 | DB (BE), Port 1, Switch 406X |
| $P_3$ | A1 | D7 (FE), Port 1, Switch 406X |
| $P_4$ | A2 | DC (FE), Port 2, Switch 406X |
| $P_5$ | A2 | D0 (BE), Port 2, Switch 406X |
| $P_6$ | A2 | DD (FE), Port 3, Switch 406X |
| $P_7$ | A2 | D1 (BE), Port 3, Switch 406X |
| $P_8$ | B1 | DE (BE), Port 4, Switch 406X |
| $P_9$ | B1 | D2 (FE), Port 4, Switch 406Y |
| $P_{10}$ | B1 | DF (BE), Port 5, Switch 406Y |
| $P_{11}$ | B1 | D3 (FE), Port 5, Switch 406Y |
| $P_{12}$ | B2 | D8 (FE), Port 6, Switch 406Y |
| $P_{13}$ | B2 | D4 (BE), Port 6, Switch 406Y |
| $P_{14}$ | B2 | D9 (FE), Port 7, Switch 406Y |
| $P_{15}$ | B2 | D5 (BE), Port 7, Switch 406Y |
| MEMORY 6 | | |
| | | DIRECTOR, PORT, SWITCH |
| $P_0$ | A1 | DD (FE), Port 0, Switch 406X |
| $P_1$ | A1 | D3 (FE), Port 0, Switch 406X |
| $P_2$ | A1 | DE (BE), Port 1, Switch 406X |
| $P_3$ | A1 | D4 (BE), Port 1, Switch 406X |
| $P_4$ | A2 | DF (BE), Port 2, Switch 406X |
| $P_5$ | A2 | D5 (BE), Port 2, Switch 406X |
| $P_6$ | A2 | D8 (FE), Port 3, Switch 406X |
| $P_7$ | A2 | D6 (FE), Port 3, Switch 406X |
| $P_8$ | B1 | D9 (FE), Port 4, Switch 406Y |
| $P_9$ | B1 | D7 (FE), Port 4, Switch 406Y |
| $P_{10}$ | B1 | DA (BE), Port 5, Switch 406Y |
| $P_{11}$ | B1 | D0 (BE), Port 5, Switch 406Y |
| $P_{12}$ | B2 | DB (BE), Port 6, Switch 406Y |
| $P_{13}$ | B2 | D1 (BE), Port 6, Switch 406Y |
| $P_{14}$ | B2 | DC (FE), Port 7, Switch 406Y |
| $P_{15}$ | B2 | D2 (FE), Port 7, Switch 406Y |
| MEMORY 7 | | |
| | | DIRECTOR, PORT, SWITCH |
| $P_0$ | A1 | D9 (FE), Port 0, Switch 406X |
| $P_1$ | A1 | D7 (FE), Port 0, Switch 406X |
| $P_2$ | A1 | DA (BE), Port 1, Switch 406X |
| $P_3$ | A1 | D0 (BE), Port 1, Switch 406X |
| $P_4$ | A2 | DB (BE), Port 2, Switch 406X |
| $P_5$ | A2 | D1 (BE), Port 2, Switch 406X |
| $P_6$ | A2 | DC (FE), Port 3, Switch 406X |
| $P_7$ | A2 | D2 (FE), Port 3, Switch 406X |
| $P_8$ | B1 | DD (FE), Port 4, Switch 406Y |
| $P_9$ | B1 | D3 (FE), Port 4, Switch 406Y |
| $P_{10}$ | B1 | DE (BE), Port 5, Switch 406Y |
| $P_{11}$ | B1 | D4 (BE), Port 5, Switch 406Y |
| $P_{12}$ | B2 | DF (BE), Port 6, Switch 406Y |
| $P_{13}$ | B2 | D5 (BE), Port 6, Switch 406Y |
| $P_{14}$ | B2 | D8 (FE), Port 7, Switch 406Y |
| $P_{15}$ | B2 | D6 (FE), Port 7, Switch 406Y |

TABLE II

| DIRECTOR | DIRECTOR PORT | CROSS-BAR SWITCH | MEMORY BOARD | MEMORY BOARD PORT | MEMORY LOGIC NETWORK |
|---|---|---|---|---|---|
| D2 | 2 | 406X | M0 | P5 | A2 |
| | 1 | 406X | M2 | P3 | A1 |
| | 0 | 406X | M4 | P1 | A1 |
| | 3 | 406X | M7 | P7 | A2 |
| | 6 | 406Y | M1 | P13 | B2 |
| | 5 | 406Y | M3 | P11 | B1 |
| | 4 | 406Y | M5 | P9 | B1 |
| | 7 | 406Y | M6 | P15 | B2 |
| DD | 5 | 406Y | M0 | P10 | B1 |
| | 6 | 406Y | M2 | P12 | B2 |
| | 7 | 406Y | M4 | P14 | B2 |
| | 4 | 406Y | M7 | P8 | B1 |
| | 1 | 406X | M1 | P2 | A1 |
| | 2 | 406X | M3 | P4 | A2 |
| | 3 | 406X | M5 | P6 | A2 |
| | 0 | 406X | M6 | P0 | A1 |
| D3 | 3 | 406X | M0 | P7 | A2 |
| | 2 | 406X | M2 | P5 | A2 |
| | 1 | 406X | M4 | P3 | A1 |
| | 0 | 406X | M6 | P1 | A1 |
| | 7 | 406Y | M1 | P15 | B2 |
| | 6 | 406Y | M3 | P13 | B2 |
| | 5 | 406Y | M5 | P11 | B1 |
| | 4 | 406Y | M7 | P9 | B1 |
| DC | 4 | 406Y | M0 | P8 | B1 |
| | 5 | 406Y | M2 | P10 | B1 |
| | 6 | 406Y | M4 | P12 | B2 |
| | 7 | 406Y | M6 | P14 | B2 |
| | 0 | 406X | M1 | P0 | A1 |
| | 1 | 406X | M3 | P2 | A1 |
| | 2 | 406X | M5 | P4 | A2 |
| | 3 | 406X | M7 | P6 | A2 |
| D9 | 1 | 406X | M0 | P2 | A1 |
| | 2 | 406X | M2 | P4 | A2 |
| | 3 | 406X | M4 | P6 | A2 |
| | 0 | 406X | M7 | P0 | A1 |
| | 5 | 406Y | M1 | P10 | B1 |
| | 6 | 406Y | M3 | P12 | B2 |
| | 7 | 406Y | M5 | P14 | B2 |
| | 4 | 406Y | M6 | P8 | B1 |
| D6 | 6 | 406Y | M0 | P13 | B2 |
| | 5 | 406Y | M2 | P11 | B1 |
| | 4 | 406Y | M4 | P9 | B1 |
| | 7 | 406Y | M7 | P15 | B2 |
| | 2 | 406X | M1 | P5 | A2 |
| | 1 | 406X | M3 | P3 | A1 |
| | 0 | 406X | M5 | P1 | A1 |
| | 3 | 406X | M6 | P7 | A2 |
| D8 | 0 | 406X | M0 | P0 | A1 |
| | 1 | 406X | M2 | P2 | A1 |
| | 2 | 406X | M4 | P4 | A2 |
| | 3 | 406X | M6 | P6 | A2 |
| | 4 | 406Y | M1 | P8 | B1 |
| | 5 | 406Y | M3 | P10 | B1 |
| | 6 | 406Y | M5 | P12 | B2 |
| | 7 | 406Y | M7 | P14 | B2 |
| D7 | 7 | 406Y | M0 | P15 | B2 |
| | 6 | 406Y | M2 | P13 | B2 |
| | 5 | 406Y | M4 | P11 | B1 |
| | 4 | 406Y | M6 | P9 | B1 |
| | 3 | 406X | M1 | P7 | A2 |
| | 2 | 406X | M3 | P5 | A2 |
| | 1 | 406X | M5 | P3 | A1 |
| | 0 | 406X | M7 | P1 | A1 |
| D0 | 4 | 406Y | M1 | P9 | B1 |
| | 7 | 406Y | M2 | P15 | B2 |
| | 6 | 406Y | M4 | P13 | B2 |
| | 5 | 406Y | M6 | P11 | B1 |
| | 0 | 406X | M0 | P1 | A1 |
| | 3 | 406X | M3 | P7 | A2 |
| | 2 | 406X | M5 | P5 | A2 |
| | 1 | 406X | M7 | P3 | A1 |
| DF | 7 | 406Y | M0 | P14 | B2 |
| | 0 | 406X | M2 | P0 | A1 |
| | 1 | 406X | M4 | P2 | A1 |

TABLE II-continued

| DIRECTOR | DIRECTOR PORT | CROSSBAR SWITCH | MEMORY BOARD | MEMORY BOARD PORT | MEMORY LOGIC NETWORK |
|---|---|---|---|---|---|
| | 2 | 406X | M6 | P4 | A2 |
| | 3 | 406X | M1 | P6 | A2 |
| | 4 | 406Y | M3 | P8 | B1 |
| | 5 | 406Y | M5 | P10 | B1 |
| | 6 | 406Y | M7 | P12 | B2 |
| D1 | 1 | 406X | M0 | P3 | A1 |
| | 0 | 406X | M2 | 1 | A1 |
| | 7 | 406Y | M4 | P15 | B2 |
| | 6 | 406Y | M6 | P13 | B2 |
| | 5 | 406Y | M4 | P11 | B1 |
| | 4 | 406Y | M3 | P9 | B1 |
| | 3 | 406X | M5 | P7 | A2 |
| | 2 | 406X | M7 | P5 | A2 |
| DE | 6 | 406Y | M0 | P12 | B2 |
| | 7 | 406Y | M2 | P14 | B2 |
| | 0 | 406X | M4 | P0 | A1 |
| | 1 | 406X | M6 | P2 | A1 |
| | 2 | 406X | M1 | P4 | A2 |
| | 3 | 406X | M3 | P6 | A2 |
| | 4 | 406Y | M5 | P8 | B1 |
| | 5 | 406Y | M7 | P10 | B1 |
| DB | 3 | 406X | M0 | P6 | A2 |
| | 4 | 406Y | M2 | P8 | B1 |
| | 5 | 406Y | M4 | P10 | B1 |
| | 6 | 406Y | M6 | P12 | B2 |
| | 7 | 406Y | M1 | P14 | B2 |
| | 0 | 406X | M3 | P6 | A1 |
| | 1 | 406X | M5 | P2 | A1 |
| | 2 | 406X | M7 | P4 | A2 |
| D4 | 4 | 406Y | M0 | P9 | B1 |
| | 3 | 406X | M2 | P7 | A2 |
| | 2 | 406X | M4 | P5 | A2 |
| | 1 | 406X | M6 | P3 | A1 |
| | 0 | 406X | M1 | P1 | A1 |
| | 7 | 406Y | M3 | P15 | B2 |
| | 6 | 406Y | M5 | P13 | B2 |
| | 5 | 406Y | M7 | P11 | B1 |
| DA | 2 | 406X | M0 | P4 | A2 |
| | 3 | 406X | M2 | P6 | A2 |
| | 4 | 406Y | M4 | P8 | B1 |
| | 5 | 406Y | M6 | P10 | B1 |
| | 6 | 406Y | M1 | P12 | B2 |
| | 7 | 406Y | M3 | P14 | B2 |
| | 0 | 406X | M5 | P0 | A1 |
| | 1 | 406X | M7 | P2 | A1 |
| D5 | 5 | 406Y | M0 | P11 | B1 |
| | 4 | 406Y | M2 | P9 | B1 |
| | 3 | 406X | M4 | P7 | A2 |
| | 2 | 406X | M6 | P5 | A2 |
| | 1 | 406X | M1 | P3 | A1 |
| | 0 | 406X | M3 | P1 | A1 |
| | 7 | 406Y | M5 | P15 | B2 |
| | 6 | 406Y | M7 | P13 | B2 |

Figure 6A:
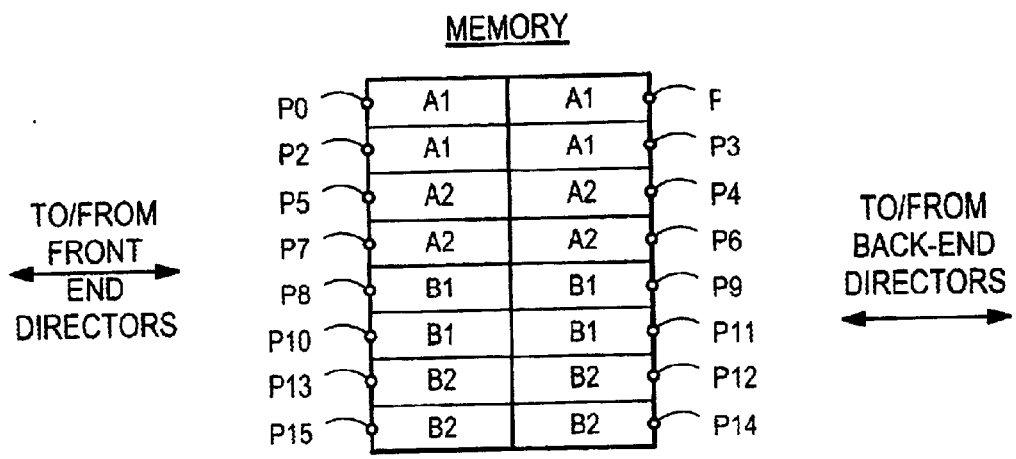
FIG. 6A is a diagram showing an exemplary one of the memory printed circuit boards used in the system of FIG. 2.

From TABLE I above, it is noted that each one of the switches (i.e., logic networks A1, A2, B1 and B2) in each domain is connected to a pair of front end director boards a pair of back-end director boards. For example, for logic networks $221_{1A}$ (i.e., logic network A1), two of its port $P_0$ and $P_2$ are connected to one of the front-end director boards while the other two of its ports $P_1$ and $P_3$ are connected to one of the back-end director boards. Reference is made to FIG. 6A. This arrangement balances the loading on any one of the logic networks and thus increases the bandwidth of the system.

As noted above, the four switches (i.e., A1, A2, B1, B2) are in two independent domains, i.e., domain A and domain B, as shown in FIG. 6. Considering the exemplary four A ports $P_0$–$P_3$, each one of the four A ports $P_0$–$P_3$ can be coupled to the A port of any one of the memory array regions 1–4 through the logic network $221_{1A}$ (i.e., A1). Thus, considering port $P_0$, such port $P_0$ can be coupled to the A port of the four memory array regions 1–4. Likewise, considering the four A ports $P_4$–$P_7$ of logic network $221_{2A}$ (i.e., A2), each one of the four A ports $P_4$–$P_7$ can be coupled to the A port of any one of the memory array regions 1–4 through the logic network $221_{2A}$. Likewise, considering the four B ports $P_8$–$P_{11}$ of logic network $221_{1B}$ (B1), each one of the four B ports $P_8$–$P_{11}$ can be coupled to the B port of any one of the memory array regions 1–4 through logic network $221_{1B}$. Likewise, considering the four B ports $P_{12}$–$P_{15}$ of logic network $221_{2B}$ (B2), each one of the four B ports $P_{12}$–$P_{15}$ can be coupled to the B port of any one of the memory arrays through the logic network $221_{2B}$. Thus, as described in the U.S. Patent referred to above, considering port $P_{12}$, such port can be coupled to the B port of the four memory array regions 1–4. Thus, there are two separate independent paths (i.e., domains) data and control from either a front-end director $180_1$–$180_{32}$ or a back-end director $200_1$–$200_{32}$ can reach each one of the four memory array regions 1–4 on the memory board. The logics A1 and A2 are in domain A and the logics B1 and B2 are in domain B.

Further, as noted above, each one of the directors has a pair of redundant ports, i.e. a 402A port and a 402B port (FIG. 5). More particularly, referring to FIG. 7, an exemplary pair of redundant directors is shown, here, for example, front-end director $180_1$ and front end-director $180_2$. It is first noted that the directors $180_1$, $180_2$ in each redundant pair of directors must be on different director boards, here boards $190_1$ (D2), $190_2$ (DD), respectively. Thus, here front-end director boards $190_1$–$190_8$ have thereon: front-end directors $180_1$, $180_3$, $180_5$ and $180_7$; front-end directors $180_2$, $180_4$, $180_6$ and $180_8$; front end directors $180_9$, $180_{11}$, $180_{13}$ and $180_{15}$; front end directors $180_{10}$, $180_{12}$, $180_{14}$ and $180_{16}$; front-end directors $180_{17}$, $180_{19}$, $180_{21}$ and $180_{23}$; front-end directors $180_{18}$, $180_{20}$, $180_{22}$ and $180_{24}$; front-end directors $180_{25}$, $180_{27}$, $180_{29}$ and $180_{31}$; front-end directors $180_{18}$, $180_{20}$, $180_{22}$ and $180_{24}$. Thus, here back-end director boards $210_1$–$210_8$ have thereon: back-end directors $200_1$, $200_3$, $200_5$ and $200_7$; back-end directors $200_2$, $200_4$, $200_6$ and $200_8$; back-end directors $200_9$, $200_{11}$, $200_{13}$ and $200_{15}$; back-end directors $200_{10}$, $200_{12}$, $200_{14}$ and $200_{16}$; back-end directors $200_{17}$, $200_{19}$, $200_{21}$ and $200_{23}$; back-end directors $200_{18}$, $200_{20}$, $200_{22}$ and $200_{24}$; back-end directors $200_{25}$, $200_{27}$, $200_{29}$ and $200_{31}$; back-end directors $200_{18}$, $200_{20}$, $200_{22}$ and $200_{24}$ as discussed the two tables above.

Figure 7:
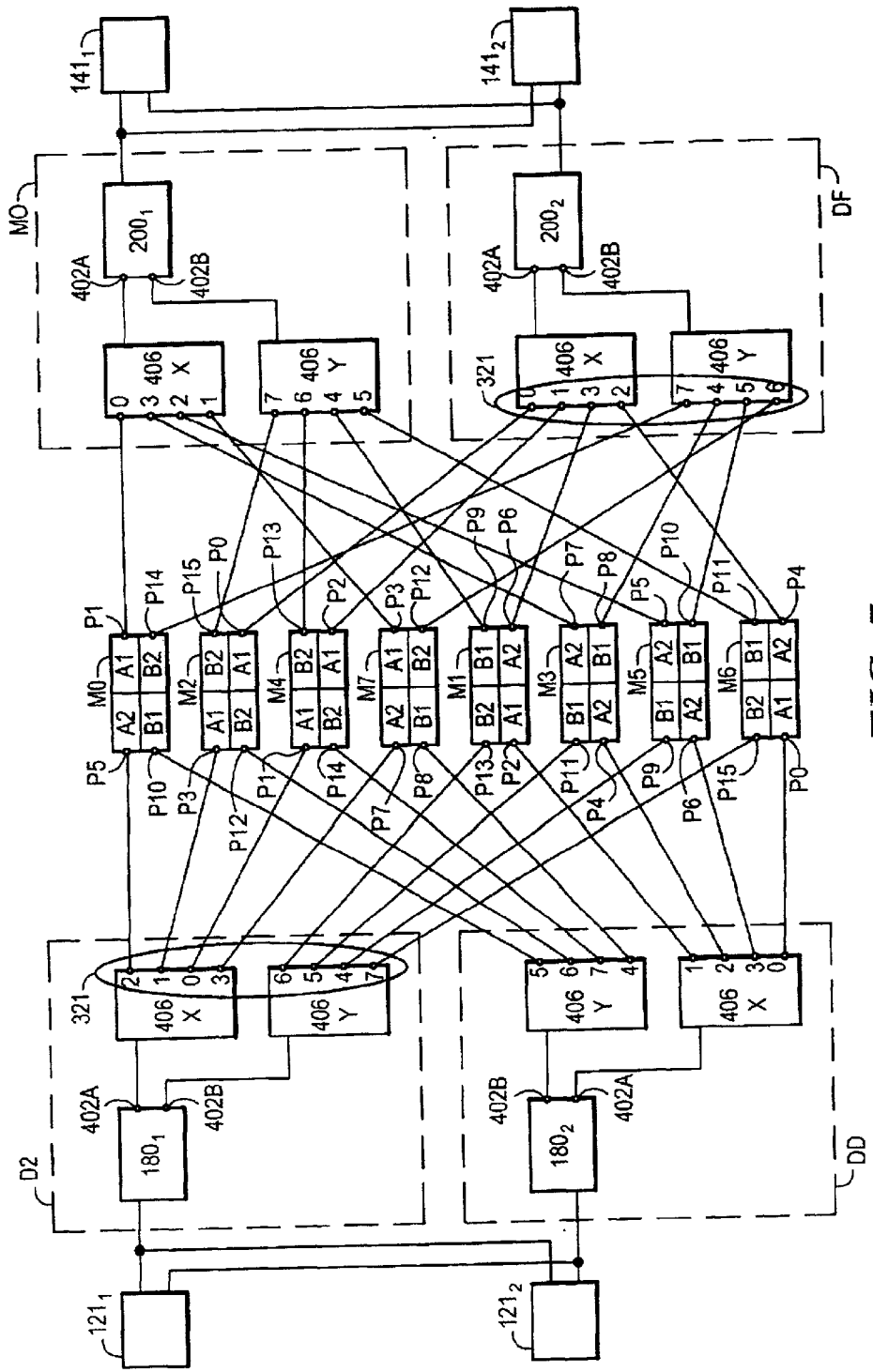
FIG. 7 is a diagram showing a pair of front-end director boards coupled between a pair of host processors and global cache memory boards and a pair of front-end director boards coupled between a pair of disk drives and global cache memory boards used in the system interface of the system of FIG. 2.

Thus, here front-end director $180_1$, shown in FIG. 7, is on front-end director board $190_1$ (D2) and its redundant, or paired, front-end director $180_2$, shown in FIG. 7, is on another front-end director board, here for example, front-end director board $190_2$ (DD). As described above, and as described in more detail in the co-pending patent applications referred to above, each director has a pair of ports 402A, 402B, as shown in FIG. 6. Port 402A of the director is connected to switch 406X of crossbar switch 318 and the port 402B of the director is connected to switch 406Y of crossbar switch 318, as shown for director $180_1$. Likewise, for redundant director $180_2$.

The crossbar switch 318 has, as noted above, eight ports collectively referred to by numerical designation 321. These port ports plug into the backplane in the arrangement shown in FIG. 8. The eight ports for each one of the director boards are designated as 0, 1, 2, 3, 4, 5, 6 and 7, as shown. Ports 0, 1, 2 and 3 are ports of the X crossbar switch 406X and ports 4, 5, 6 and 7 are ports of the Y crossbar switch 406Y.

It is noted that, for each memory board M0–M7, the logic in domain A (A1 or A2) is connected to one of the redundant pair of director boards while the logic in the domain B (B1 or B2) is connected to the other one of the redundant pair of director boards. Thus, here, for memory board M0, logic A2 is connected to director $180_1$ of board D2 while logic B1 of memory board M0 is connected to director $180_2$ of director board DD.

Further, it is noted that each director can be coupled to different domains of a pair of memory boards. For example, director $180_1$ may be coupled to domain A (here logic A2) of memory board M0 through switch 406X and if such switch fails, to domain B (here logic B2) via switch 406Y on such director board DD.

Further, if director $180_1$ fails, the memory M0 can be accessed via director $180_2$. If domain A of memory M0 fails, the data in memory M0 can be accessed through its domain B logic through director $180_2$. Thus, as stated more generally, each memory is accessible, via one of its domains, to one of a pair of directors and is also accessible, via its other domain, to the other one of the pair of directors. Further, it should be noted that each director is able to access a pair of memory boards. This later arrangement enables a dual write capability. That is, the data in a director may be written into memory boards. That is, with the arrangement shown, a director is able to write the same data into two different memories. Thus, for example, director $180_1$ on board D2 can write data into memory M0 via switch 406X on board D2 and can write the same data into its paired memory M1 via switch 406Y on board D2. This is a dual-write feature with a point-to-point memory/director connection arrangement.

Finally it should be noted that each one of the paired host computer processors $121_1$, $121_2$ can access the same memory through either one of the paired directors D2, DD. Thus, for example if one of the paired director boards fails, say board D2, host computer processor $121_1$ can access memory M0 through its paired director board DD. It is noted that this arrangement applies to the back-end directors as shown in FIG. 7 for paired back-end directors D0 and DF.

The slots in the wired backplane for the director printed circuit boards and memory printed circuit boards are shown in FIG. 8.

The connections to the ports of the director boards and the memory boards via the backplane are presented in the Tables I and II, above.

Consider now a customer for that data storage system requires only half the memory as that shown and described above in connection with FIG. 2. That is, instead of eight memory boards the customer requires four memory boards. However, it is desired that the system operate with the redundancy and dual write capability described above, but with only four memory boards using the same backplane wiring as that for the eight memory board case described above.

To achieve this result, dummy memory boards and dummy directors are inserted into slots of the backplane otherwise occupied. These dummy boards do not have directors or memory arrays but rather have jumpers connected pair of ports of the dummy director board or dummy memory board, as the case may be, to be described. As will be shown, the use of these jumpers achieves the desired redundancy and dual write features described above.

Figure 9:
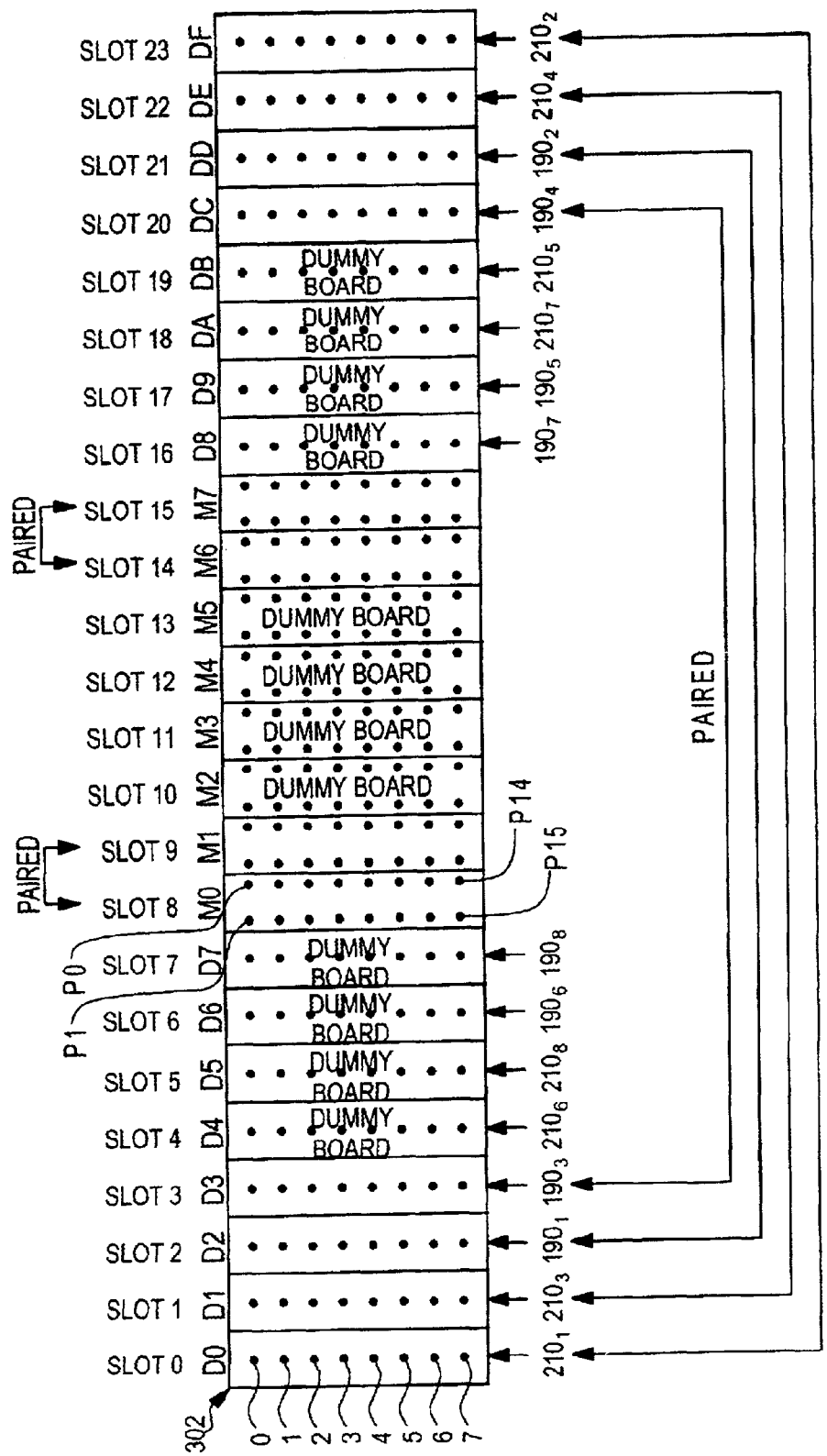
FIG. 9 is an elevation view of a backplane used in the system of FIG. 2, such backplane having slots adapted to receive front-end director printed circuit boards, back-end director printed circuit boards, memory boards and dummy front-end director printed circuit boards, dummy back-end director printed circuit boards, dummy memory boards, such dummy printed circuit boards having jumpers to enable the same backplane to be used with a fully populated system having all of the memory boards and directors in FIG. 2 and a de-populated system having only a portion of the all of the memory boards and directors in FIG. 2.
Figure 10:
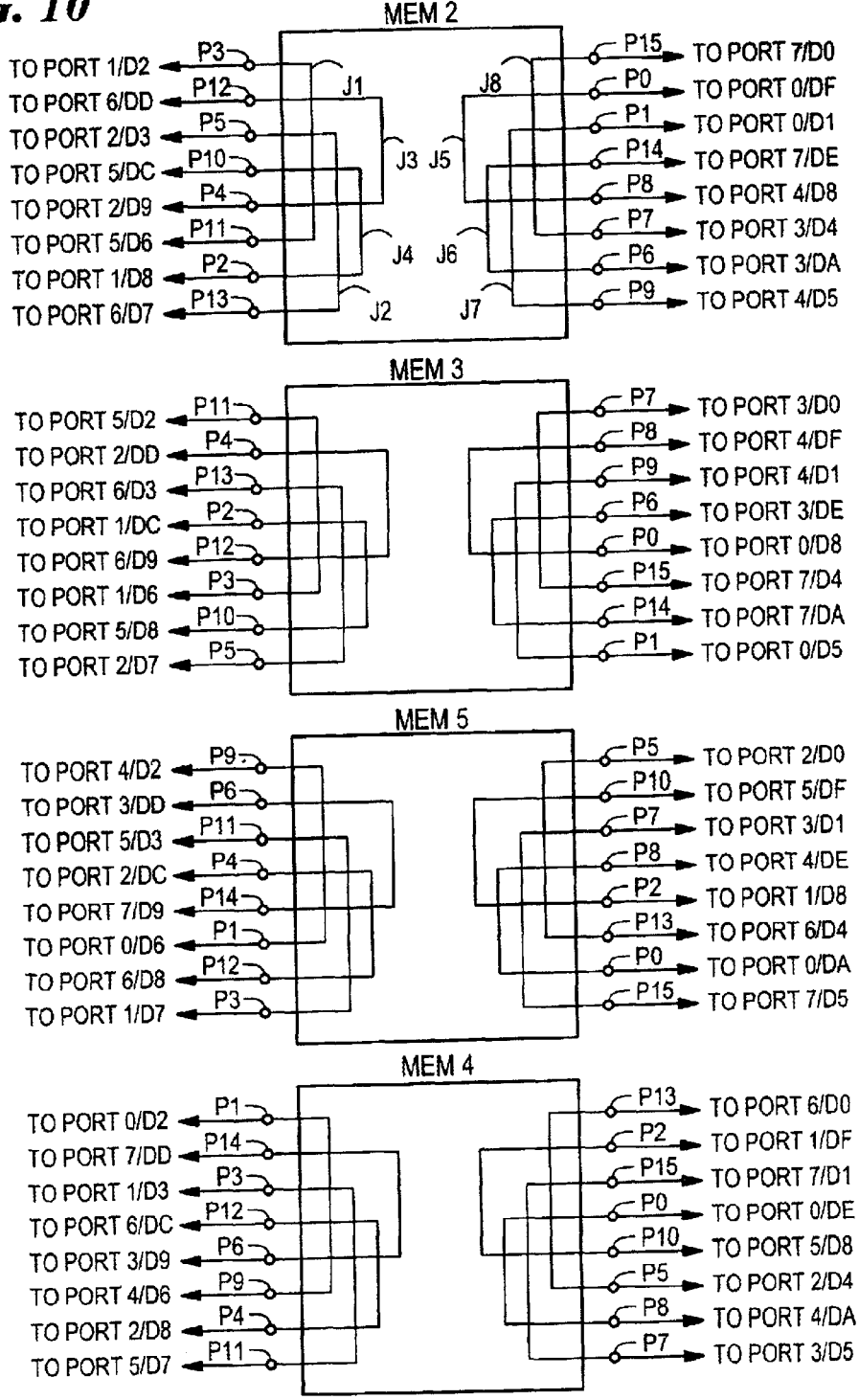
FIG. 10 shows the dummy memory boards used in the de-populated system.

Referring to FIG. 9, the slots in the backplane 302 are shown for a system having only 4 memory boards and eight director boards. Thus, here memory boards M2, M3, M4 and M5 are replaced with dummy memory boards used in place of here memory boards M2, M3, M4 and M5, as shown in FIG. 10. The jumpers are indicated by J, here eight jumpers J1–J8, being used to connect pairs of the memory board ports for each of the dummy memory boards used in place of memory boards M2, M3, M4 and M5, as shown in FIG. 9. The connections provided by the jumpers for dummy memory boards M2, M3, M4 and M5 are: P0 TO P8; P2 TO P10; P3 TO P11; P4 TO P12; P5 TO P13; P6 TO P14; and P7 TO P15, as shown in FIG. 10.

Figure 12:
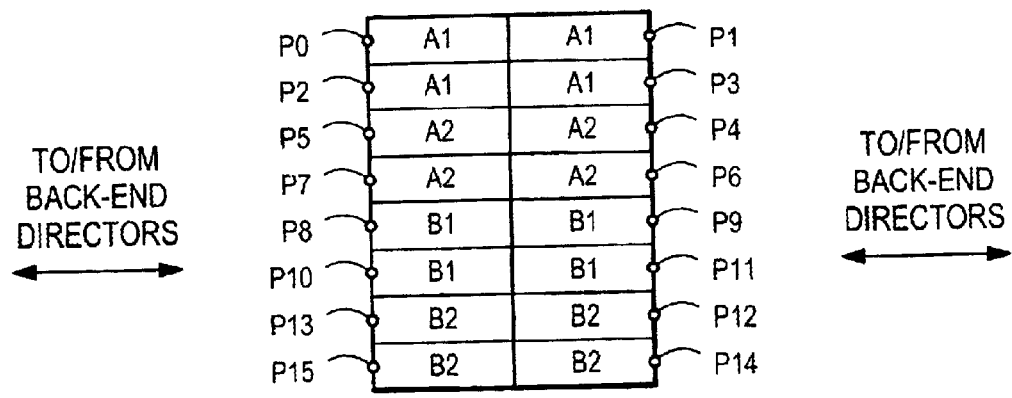
FIG. 12 is a diagram showing an exemplary one of the memory printed circuit boards used in the de-populated system.
Figure 11:
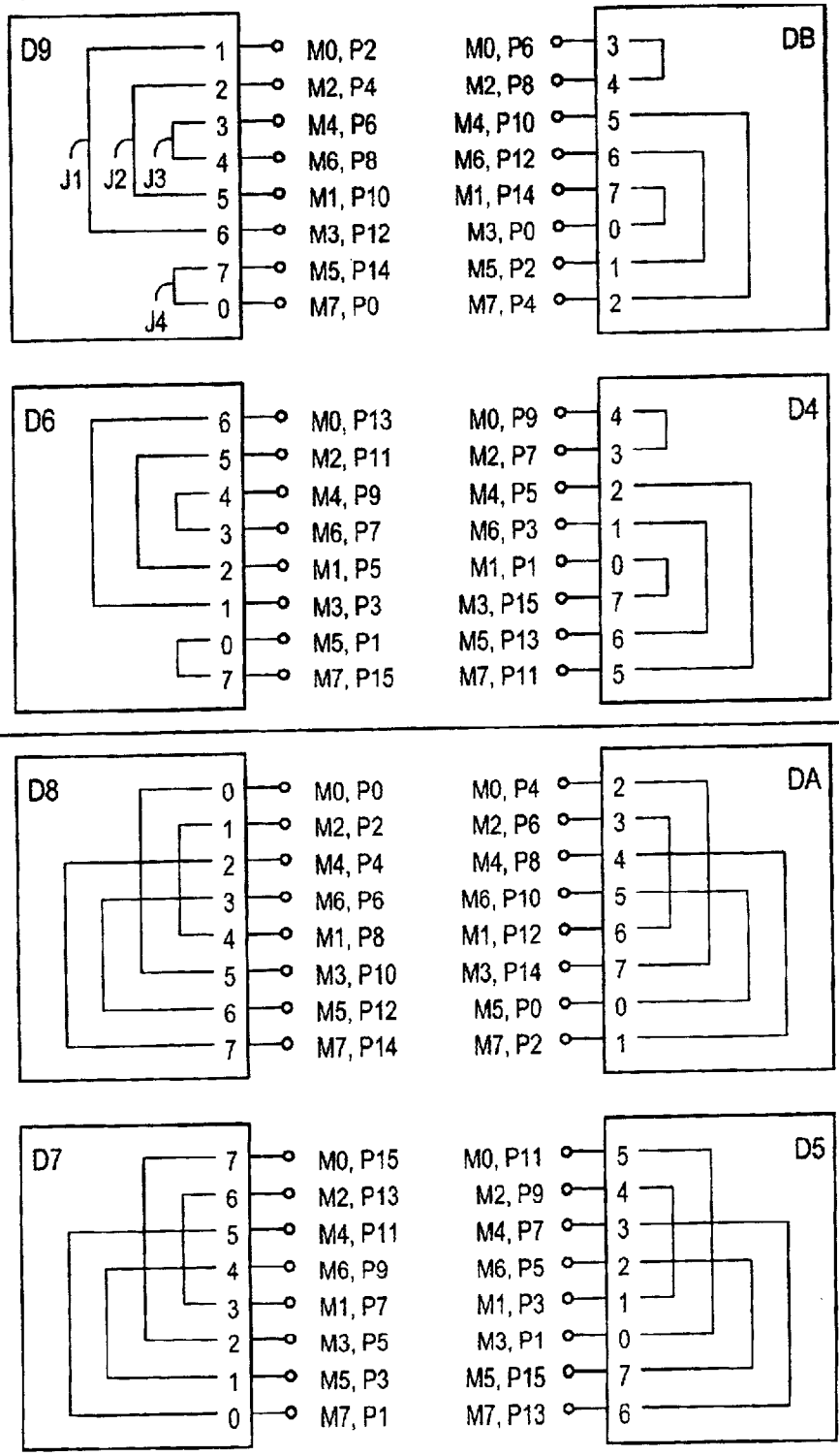
FIG. 11 shows the dummy director boards used in the de-populated system.

Likewise, as shown in FIG. 9, the slots in the backplane 302 occupied by director boards D9, D6, D8, D7, DB, D4, DA and D5 in a fully populated system are replaced with dummy director boards shown in FIG. 11. The jumpers are indicated by J, here eight jumpers J1–J8, being used to connect pairs of the director board ports for each of the dummy director boards used in place of director boards D9, D6, D8, D7, DB, D4, DA AND D5, as shown in FIG. 12. The connections provided by the jumpers for directors boards D9, D6, DB and D4 are: PORT 0 TO PORT 7; PORT 1 TO PORT 6; PORT 2 TO PORT 5; and PORT 3 TO PORT 4 while connections provided by the jumpers for directors boards D8, DA, D7 and D5 are PORT 0 TO PORT 5; PORT 1 TO PORT 4; PORT 2 TO PORT 7; and PORT 3 TO PORT 6. as shown in FIG. 11.

These jumpers result in connections between memory boards M0, M1, M6 and M7 and directors D0, D1, D2, D3, DC, DD, DE AND DF are in the following Tables II and IV, respectively, below:

TABLE III

| | | MEMORY 0 | |
|---|---|---|---|
| PORT | LOGIC | DIRECTOR (END), PORT, SWITCH | PATH |
| $P_0$ | A1 | DC (FE), Port 1, Switch 406X | D8 PORT 0, D8 PORT 5; M3, P10; M3, P2 |
| $P_1$ | A1 | D0 (BE), Port 0, Switch 406X | DIRECT |
| $P_2$ | A1 | DD (FE), Port 2, Switch 406X | D9 PORT 1; D9 PORT 6; M3, P12; M3, P4 |
| $P_3$ | A1 | D1 (BE), Port 1, Switch 406X | DIRECT |
| $P_4$ | A2 | DE (BE), Port 3, Switch 406X | DA PORT 2; DA PORT 7; M3, P14; M3, P6; |
| $P_5$ | A2 | D2 (FE), Port 2, Switch 406X | DIRECT |
| $P_6$ | A2 | DF (BE), Port 0, Switch 406X | DB PORT 3; DB PORT 4; M2, P8; M2, P0 |
| $P_7$ | A2 | D3 (FE), Port 3, Switch 406X | DIRECT |
| $P_8$ | B1 | DC (FE), Port 4, Switch 406Y | DIRECT |
| $P_9$ | B1 | D0 (BE), Port 7, Switch 406Y | D4 PORT 4; D4 PORT 3; M2, P7; M2, P15 |
| $P_{10}$ | B1 | DD (FE), Port 5, Switch 406Y | DIRECT |
| $P_{11}$ | B1 | D1 (BE), Port 4, Switch 406Y | D5 PORT 5; D5 PORT 0; M3, P1; M3, P4 |

TABLE III-continued

| | | | |
|---|---|---|---|
| $P_{12}$ | B2 | DE (BE), Port 6, Switch 406Y | DIRECT |
| $P_{13}$ | B2 | D2 (FE), Port 5, Switch 406Y | D6 PORT 6; D6 PORT 1; M3, P3; M3, P11 |
| $P_{14}$ | B2 | DF (BE), Port 7, Switch 406Y | DIRECT |
| $P_{15}$ | B2 | D3 (FE), Port 6, Switch 406Y | D7 PORT 7; D7 PORT 2; M3, P5; M3, P13 |

MEMORY 1

| PORT | PORT | DIRECTOR, PORT, SWITCH | PATH |
|---|---|---|---|
| $P_0$ | A1 | DC (FE), Port 0, Switch 406X | DIRECT |
| $P_1$ | A1 | D0 (BE), Port 3, Switch 406X | D4 PORT 0; D4 PORT 7; M3, P15; M3, P7 |
| $P_2$ | A1 | DD (FE), Port 1, Switch 406X | DIRECT |
| $P_3$ | A1 | D1 (BE), Port 0, Switch 406X | D5 PORT 1; D5 PORT 4; M2, P9; M2, P1 |
| $P_4$ | A2 | DE (BE), Port 2, Switch 406X | DIRECT |
| $P_5$ | A2 | D2 (FE), Port 1, Switch 406X | D6 PORT 2; D6 PORT 5; M2, P11; M2, P3 |
| $P_6$ | A2 | DF (BE), Port 3, Switch 406X | DIRECT |
| $P_7$ | A2 | D3 (FE), Port 2, Switch 406X | D7 PORT 3; D7 PORT 6; M2, P13; M2, P5 |
| $P_8$ | B1 | DC (FE), Port 5, Switch 406Y | D8 PORT 4; D8 PORT 1; M2, P2; M2, P10 |
| $P_9$ | B1 | D0 (BE), Port 4, Switch 406Y | DIRECT |
| $P_{10}$ | B1 | DD (FE), Port 6, Switch 406Y | D9 PORT 5; D9 PORT 2; M2, P4; M2, P12 |
| $P_{11}$ | B1 | D1 (BE), Port 5, Switch 406Y | DIRECT |
| $P_{12}$ | B2 | DE (BE), Port 7, Switch 406Y | DA PORT 6; DA PORT 3; M2, P6; M2, P4 |
| $P_{13}$ | B2 | D2 (FE), Port 6, Switch 406Y | DIRECT |
| $P_{14}$ | B2 | DF (BE), Port 4, Switch 406Y | DB PORT 7, DB PORT 0; M3, P0; M3, P8 |
| $P_{15}$ | B2 | D3 (FE), Port 7, Switch 406Y | DIRECT |

DUMMY MEMORY 2

| PORT | PORT | DIRECTOR, PORT, SWITCH/JUMPER |
|---|---|---|
| $P_0$ | $P_8$ | DF (BE), Port 0, Switch 406X |
| $P_1$ | $P_9$ | D1 (BE), Port 0, Switch 406X |
| $P_2$ | $P_{10}$ | D8 (FE), Port 1, Jumper |
| $P_3$ | $P_{11}$ | D2 (FE), Port 1, Switch 406X |
| $P_4$ | $P_{12}$ | D9 (FE), Port 2, Jumper |
| $P_5$ | $P_{13}$ | D3 (FE), Port 2, Switch 406X |
| $P_6$ | $P_{14}$ | DA (BE), Port 3, Jumper |
| $P_7$ | $P_{15}$ | D4 (BE), Port 3, Jumper |
| $P_8$ | $P_0$ | DB (BE), Port 4, Jumper |
| $P_9$ | $P_1$ | D5 (BE), Port 4, Jumper |
| $P_{10}$ | $P_2$ | DC (FE), Port 5, Switch 406Y |
| $P_{11}$ | $P_3$ | D6 (FE), Port 5, Jumper |
| $P_{12}$ | $P_4$ | DD (FE), Port 6, Switch 406Y |
| $P_{13}$ | $P_5$ | D7 (FE), Port 6, Jumper |
| $P_{14}$ | $P_6$ | DE (BE), Port 7, Switch 406Y |
| $P_{15}$ | $P_7$ | D0 (BE), Port 7, Switch 406Y |

DUMMY MEMORY 3

| PORT | PORT | DIRECTOR, PORT, SWITCH/JUMPER |
|---|---|---|
| $P_0$ | $P_8$ | DB (BE), Port 0, Jumper |
| $P_1$ | $P_9$ | D5 (BE), Port 0, Jumper |
| $P_2$ | $P_{10}$ | DC (FE), Port 1, Switch 406X |
| $P_3$ | $P_{11}$ | D6 (FE), Port 1, Jumper |
| $P_4$ | $P_{12}$ | DD (FE), Port 2, Switch 406X |
| $P_5$ | $P_{13}$ | D7 (FE), Port 2, Jumper |
| $P_6$ | $P_{14}$ | DE (BE), Port 3, Switch 406X |
| $P_7$ | $P_{15}$ | D0 (BE), Port 3, Switch 406X |
| $P_8$ | $P_0$ | DF (BE), Port 4, Switch 406Y |
| $P_9$ | $P_1$ | D1 (BE), Port 4, Switch 406Y |
| $P_{10}$ | $P_2$ | D8 (FE), Port 5, Jumper |
| $P_{11}$ | $P_3$ | D2 (FE), Port 5, Switch 406Y |
| $P_{12}$ | $P_4$ | D9 (FE), Port 6, Jumper |
| $P_{13}$ | $P_5$ | D3 (FE), Port 6, Switch 406Y |
| $P_{14}$ | $P_6$ | DA (BE), Port 7, Jumper |
| $P_{15}$ | $P_7$ | D4 (BE), Port 7, Jumper |

DUMMY MEMORY 4

| PORT | | DIRECTOR, PORT, SWITCH/JUMPER |
|---|---|---|
| $P_0$ | $P_8$ | DE (BE), Port 0, Switch 406X |
| $P_1$ | $P_9$ | D2 (FE), Port 0, Switch 406X |
| $P_2$ | $P_{10}$ | DF (BE), Port 1, Switch 406X |
| $P_3$ | $P_{11}$ | D3 (FE), Port 1, Switch 406X |
| $P_4$ | $P_{12}$ | D8 (FE), Port 2, Jumper |

TABLE III-continued

| | | |
|---|---|---|
| $P_5$ | $P_{13}$ | D4 (BE), Port 2, Jumper |
| $P_6$ | $P_{14}$ | D9 (FE), Port 3, Jumper |
| $P_7$ | $P_{15}$ | D5 (BE), Port 3, Jumper |
| $P_8$ | $P_0$ | DA (BE), Port 4, Jumper |
| $P_9$ | $P_1$ | D6 (FE), Port 4, Jumper |
| $P_{10}$ | $P_2$ | DB (BE), Port 5, Jumper |
| $P_{11}$ | $P_3$ | D7 (FE), Port 5, Jumper |
| $P_{12}$ | $P_4$ | DC (FE), Port 6, Switch 406Y |
| $P_{13}$ | $P_5$ | D0 (BE), Port 6, Switch 406Y |
| $P_{14}$ | $P_6$ | DD (FE), Port 7, Switch 406Y |
| $P_{15}$ | $P_7$ | D1 (BE), Port 7, Switch 406Y |

DUMMY MEMORY 5

| PORT | PORT | DIRECTOR, PORT, SWITCH/JUMPER |
|---|---|---|
| $P_0$ | $P_8$ | DA (BE), Port 0, Jumper |
| $P_1$ | $P_9$ | D6 (FE), Port 0, Jumper |
| $P_2$ | $P_{10}$ | DB (BE), Port 1, Jumper |
| $P_3$ | $P_{11}$ | D7 (FE), Port 1, Jumper |
| $P_4$ | $P_{12}$ | DC (FE), Port 2, Switch 406X |
| $P_5$ | $P_{13}$ | D0 (BE), Port 2, Switch 406X |
| $P_6$ | $P_{14}$ | DD (FE), Port 3, Switch 406X |
| $P_7$ | $P_{15}$ | D1 (BE), Port 3, Switch 406X |
| $P_8$ | $P_0$ | DE (BE), Port 4, Switch 406Y |
| $P_9$ | $P_1$ | D2 (FE), Port 4, Switch 406Y |
| $P_{10}$ | $P_2$ | DF (BE), Port 5, Switch 406Y |
| $P_{11}$ | $P_3$ | D3 (FE), Port 5, Switch 406Y |
| $P_{12}$ | $P_4$ | D8 (FE), Port 6, Jumper |
| $P_{13}$ | $P_5$ | D4 (BE), Port 6, Jumper |
| $P_{14}$ | $P_6$ | D9 (FE), Port 7, Jumper |
| $P_{15}$ | $P_7$ | D5 (BE), Port 7, Jumper |

MEMORY 6

| PORT | LOGIC | DIRECTOR, PORT, SWITCH | PATH |
|---|---|---|---|
| $P_0$ | A1 | DD (FE), Port 0, Switch 406X | DIRECT |
| $P_1$ | A1 | D3 (FE), Port 0, Switch 406X | DIRECT |
| $P_2$ | A1 | DE (BE), Port 1, Switch 406X | DIRECT |
| $P_3$ | A1 | D0 (BE), Port 2, Switch 406X | D4 PORT 1; D4 PORT 6; M5, P13; M5, P5 |
| $P_4$ | A2 | DF (BE), Port 2, Switch 406X | DIRECT |
| $P_5$ | A2 | D1 (BE), Port 3, Switch 406X | D5 PORT 2; D5 PORT 7; M5, P15; M5, P7 |
| $P_6$ | A2 | DC (FE), Port 2, Switch 406X | D8 PORT 5; D8 PORT 6; M5, P12; M5, P4 |
| $P_7$ | A2 | D2 (FE), Port 0, Switch 406X | D6 PORT 3; D6 PORT 4; M4, P9; M4, P1 |
| $P_8$ | B1 | DD (FE), Port 7, Switch 406Y | D9 PORT 4; D9 PORT 3; M4, P6; M4, P14 |
| $P_9$ | B1 | D3 (FE), Port 5, Switch 406Y | D7 PORT 4; D7 PORT 1; M5, P3; M5, P11 |
| $P_{10}$ | B1 | DE (BE), Port 4, Switch 406Y | DA PORT 5; DA PORT 0; M5, P0; M5, P8 |
| $P_{11}$ | B1 | D0 (BE), Port 5, Switch 406Y | DIRECT |
| $P_{12}$ | B2 | DF (BE), Port 5, Switch 406Y | DB PORT 6; DB PORT 4; M5, P2; M5, P10 |
| $P_{13}$ | B2 | D1 (BE), Port 6, Switch 406Y | DIRECT |
| $P_{14}$ | B2 | DC (FE), Port 7, Switch 406Y | DIRECT |
| $P_{15}$ | B2 | D2 (FE), Port 7, Switch 406Y | DIRECT |

MEMORY 7

| PORT | LOGIC | DIRECTOR, PORT, SWITCH | PATH |
|---|---|---|---|
| $P_0$ | A1 | DD (FE), Port 3, Switch 406Y | D9 PORT 0; D9 PORT 7; M5, P14; M5, P6 |
| $P_1$ | A1 | D3 (FE), Port 1, Switch 406X | D7 PORT 4; D7 PORT 1; M5, P3,; M5, P11 |
| $P_2$ | A1 | DE (BE), Port 0, Switch 406X | DA PORT 1; DA PORT 4; M4, P8; M4, P0 |
| $P_3$ | A1 | D0 (BE), Port 1, Switch 406X | DIRECT |
| $P_4$ | A2 | DF (BE), Port 1, Switch 406X | DB PORT 2; DB PORT 5; M4, P10; M4, P2 |
| $P_5$ | A2 | D1 (BE), Port 2, Switch 406X | DIRECT |
| $P_6$ | A2 | DC (FE), Port 3, Switch 406X | DIRECT |
| $P_7$ | A2 | D2 (FE), Port 3, Switch 406X | DIRECT |
| $P_8$ | B1 | DD (FE), Port 4, Switch 406Y | DIRECT |
| $P_9$ | B1 | D3 (FE), Port 4, Switch 406Y | DIRECT |
| $P_{10}$ | B1 | DE (BE), Port 5, Switch 406Y | DIRECT |
| $P_{11}$ | B1 | D0 (BE), Port 6, Switch 406Y | D4 PORT 5; D4 PORT 2; M4, P5; M4, P13 |
| $P_{12}$ | B2 | DF (BE), Port 6, Switch 406Y | DIRECT |
| $P_{13}$ | B2 | D1 (BE), Port 7, Switch 406Y | D5 PORT 6; D5 PORT 3; M4,P7; M4, P15 |
| $P_{14}$ | B2 | DC (FE), Port 6, Switch 406Y | D8 PORT 7; D8 PORT 2; M4, P4; M4, P12 |
| $P_{15}$ | B2 | D2 (FE), Port 4, Switch 406Y | D6, PORT 7; D6 PORT 0; M5, P1; M5, P9 |

TABLE IV

| DIRECTOR | DIRECTOR PORT | CROSSBAR SWITCH | MEMORY BOARD | MEMORY BOARD PORT | MEMORY LOGIC NETWORK |
|---|---|---|---|---|---|
| D2 | 2 | 406X | M0 | P5 | A2 |
|    | 1 | 406X | M1 | P5 | A2 |
|    | 0 | 406X | M6 | P7 | A2 |
|    | 7 | 406Y | M6 | P15 | B2 |
|    | 6 | 406Y | M1 | P13 | B2 |
|    | 5 | 406Y | M0 | P13 | B2 |
|    | 4 | 406Y | M7 | P15 | B2 |
|    | 3 | 406X | M7 | P7 | A2 |
| DD | 5 | 406Y | M0 | P10 | B1 |
|    | 6 | 406Y | M1 | P10 | B1 |
|    | 7 | 406Y | M6 | P8 | B1 |
|    | 0 | 406X | M6 | P0 | A1 |
|    | 1 | 406X | M1 | P2 | A1 |
|    | 2 | 406X | M0 | P2 | A1 |
|    | 3 | 406X | M7 | P0 | A1 |
|    | 4 | 406Y | M7 | P8 | B1 |
| D3 | 3 | 406X | M0 | P7 | A2 |
|    | 2 | 406X | M1 | P7 | A2 |
|    | 1 | 406X | M7 | P1 | A1 |
|    | 0 | 406X | M6 | P1 | A1 |
|    | 7 | 406Y | M1 | P15 | B2 |
|    | 6 | 406Y | M0 | P15 | B2 |
|    | 5 | 406Y | M6 | P9 | B1 |
|    | 4 | 406Y | M7 | P9 | B1 |
| DC | 4 | 406Y | M0 | P8 | B1 |
|    | 5 | 406Y | M1 | P8 | B1 |
|    | 6 | 406Y | M7 | P14 | B2 |
|    | 7 | 406Y | M6 | P14 | B2 |
|    | 0 | 406X | M1 | P0 | A1 |
|    | 1 | 406X | M0 | P0 | A1 |
|    | 2 | 406X | M0 | P6 | A2 |
|    | 3 | 406X | M7 | P6 | A2 |
| D0 | 0 | 406X | M0 | P1 | A1 |
|    | 7 | 406Y | M0 | P9 | B1 |
|    | 6 | 406Y | M7 | P11 | B1 |
|    | 5 | 406Y | M6 | P11 | B1 |
|    | 4 | 406Y | M1 | P9 | B1 |
|    | 3 | 406X | M1 | P1 | A1 |
|    | 2 | 406X | M6 | P3 | A1 |
|    | 1 | 406X | M7 | P3 | A1 |
| DF | 7 | 406Y | M0 | P14 | B2 |
|    | 0 | 406X | M0 | P6 | A2 |
|    | 1 | 406X | M7 | P4 | A2 |
|    | 2 | 406X | M6 | P4 | A2 |
|    | 3 | 406X | M1 | P6 | A2 |
|    | 4 | 406Y | M1 | P14 | B2 |
|    | 5 | 406Y | M6 | P12 | B2 |
|    | 6 | 406Y | M7 | P12 | B2 |
| D1 | 1 | 406X | M0 | P3 | A1 |
|    | 0 | 406X | M1 | P3 | A1 |
|    | 7 | 406Y | M7 | P13 | A2 |
|    | 6 | 406Y | M6 | P13 | B2 |
|    | 5 | 406Y | M1 | P11 | B1 |
|    | 4 | 406Y | M0 | P11 | P11 |
|    | 3 | 406X | M6 | P5 | A2 |
|    | 2 | 406X | M7 | P5 | A2 |
| DE | 6 | 406Y | M0 | P12 | B2 |
|    | 7 | 406Y | M1 | P12 | B2 |
|    | 0 | 406X | M7 | P2 | A1 |
|    | 1 | 406X4 | M6 | P2 | A1 |
|    | 2 | 406X | M1 | P4 | A2 |
|    | 3 | 406X | M0 | P4 | A2 |
|    | 4 | 406Y | M6 | P10 | B1 |
|    | 5 | 406Y | M7 | P10 | B1 |

It should be noted that the redundancy and dual write features of a fully populated system, described in detail in FIG. 7 are features retained in the de-populated system, here with only 4 memory boards and 8 director boards. Further, in will be noted that in this de-populated system, each logic network on the memory board is coupled to a pair of front end directors and a pair of back end directors as shown from the TABLES III and IV above.

Figure 13:
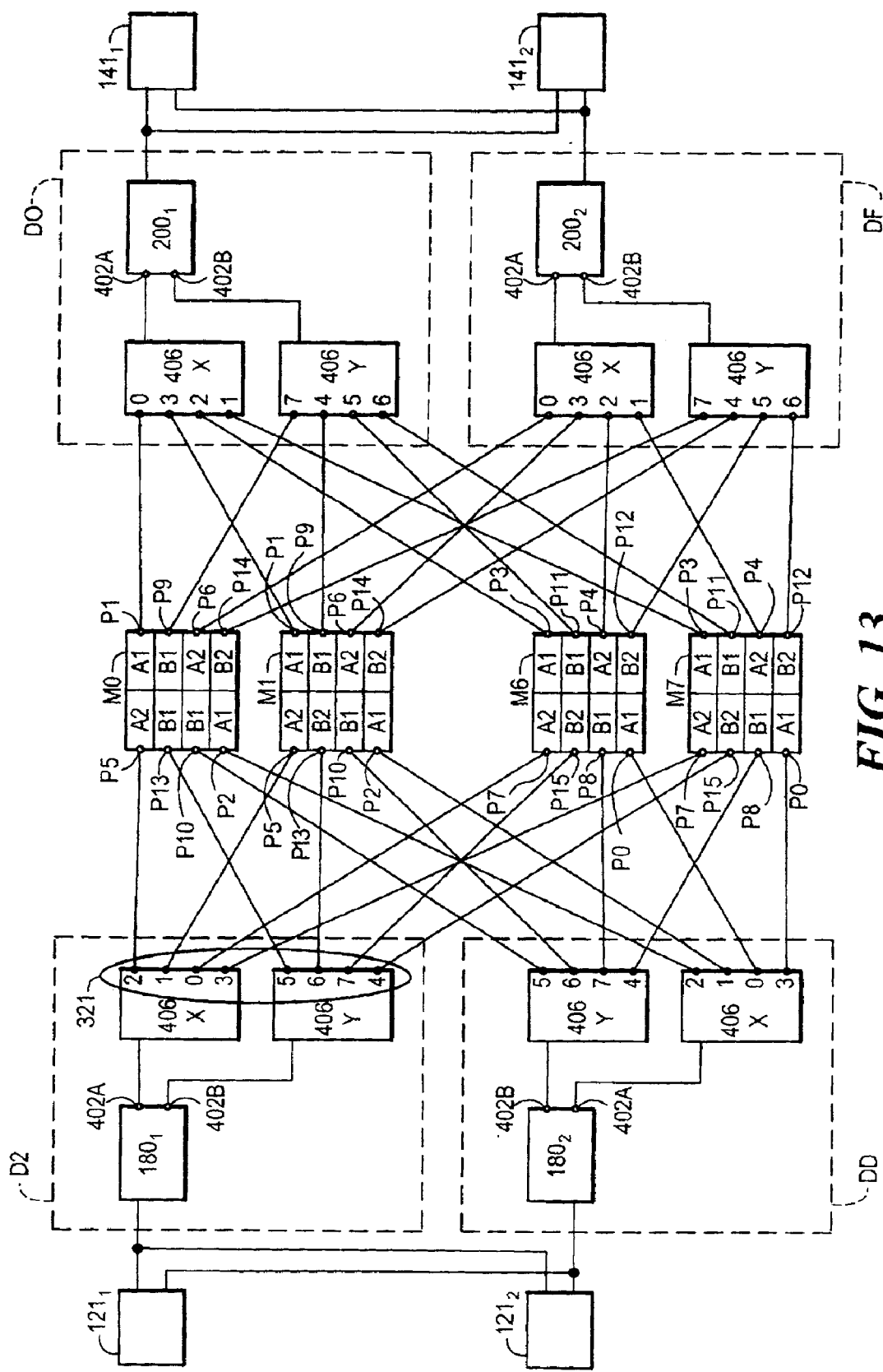
FIG. 13 is a diagram showing a pair of front-end director boards coupled between a pair of host processors and global cache memory boards and a pair of front-end director boards coupled between a pair of disk drives and global cache memory boards used in the system interface of the de-populated system.

More particularly, as noted above, each one of the directors has a pair of redundant ports, i.e., 402A port and 402B port (FIG. 5). Thus, referring to FIG. 13 for the 4 memory/8 director system (referred to as the de-populated system), an exemplary pair of redundant directors is shown, here, for example, front-end director 180$_1$ and front end-director 180$_2$. It is first noted that the directors 180$_1$, 180$_2$ in each redundant pair of directors are again on different director boards, here boards 190$_1$ (D2), 190$_2$ (DD), respectively. Thus, here front-end director 180$_1$, shown in FIG. 15, is on front-end director board 190$_1$ (D2) and its redundant front-end director 180$_2$, shown in FIG. 13, is on another front-end director board, here for example, front-end director board 190$_2$ (DD). As described above, each director has a pair of ports 402A, 402B, as shown in FIG. 15. Port 402A of the director is connected to switch 406X of crossbar switch 318 and the port 402B of the director is connected to switch 406Y of crossbar switch 318, as shown for director 180$_1$. Likewise, for redundant director 180$_2$.

The crossbar switch 318 has, as noted above, eight ports collectively referred to by numerical designation 321. These port ports plug into the backplane in the arrangement shown in FIG. 9. The eight ports for each one of the director boards are designated as 0, 1, 2, 3, 4, 5, 6 and 7, as shown. Ports 0, 1, 2 and 3 are ports of the X crossbar switch 406X and ports 4, 5, 6 and 7 are ports of the Y crossbar switch 406Y.

It is noted that because of the jumpers on the memory boards and director boards described above, instead of the eight ports of the director board being coupled to memory elements (i.e., memory regions 1–4) on eight memory board, here they are connected to only four memory boards. Thus, referring to FIG. 13, director board D2 and paired director board DD are each connected only four memory boards, here memory boards M0, M1, M6 and M7, as shown.

Further, it is noted that each director can be coupled to different domains of a pair of memory boards. For example, director 180$_1$ on director board D2 may be coupled to domain A (here logic A2) of memory board M0 through switch 406X and if such switch fails, to domain B (here logic B2) of memory board M0 through switch 406Y on such director board D2.

Further, if director 180$_1$ fails, the memory M0 can be accessed via director 180$_2$. If domain A of memory M0 fails, the data in memory M0 can be accessed through its domain B logic through director 180$_2$. Thus, as stated more generally, each memory is accessible, via one of its domains, to one of a pair of directors and is also accessible, via its other domain, to the other one of the pair of directors. Further, it should be noted that each director is able to access a pair of memory boards. This later arrangement enables a dual write capability. That is, the data in a director may be written into memory boards. That is, with the arrangement shown, a director is able to write the same data into two different memories. Thus, for example, director 180$_1$ on board D2 can write data into memory M0 via switch 406X on board D2 and can write the same data into its paired memory M1 via switch 406Y on board D2. This is a dual-write feature with a point-to-point memory/director connection arrangement.

It should be noted that each one of the paired host computer processors 121$_1$, 121$_2$ can access the same memory through either one of the paired directors D2, DD. Thus, for example if one of the paired director boards fails, say board D2, host computer processor 121$_1$ can access memory M0 through its paired director board DD.

It is noted that this arrangement applies to the back-end directors as shown in FIG. 7 for paired back-end directors D0 and DF.

It is first noted that, referring to FIG. 10, all dummy (jumper) memory boards have the same jumper arrangement. It is next noted from FIG. 11, that the jumper arrangements used for director boards D9, DB, D6, and D4 are the same. Here all such director boards D9, DB, D6, and D4 have the jumpers arranged in a hereinafter referred to type "A" configuration. Further, the jumper arrangements for director boards D8, DA, D7 and D5 are the same. Here all such director boards D8, DA, D7 and D5 have the jumpers arranged in a hereinafter referred to different type "B" configuration.

Figure 14:
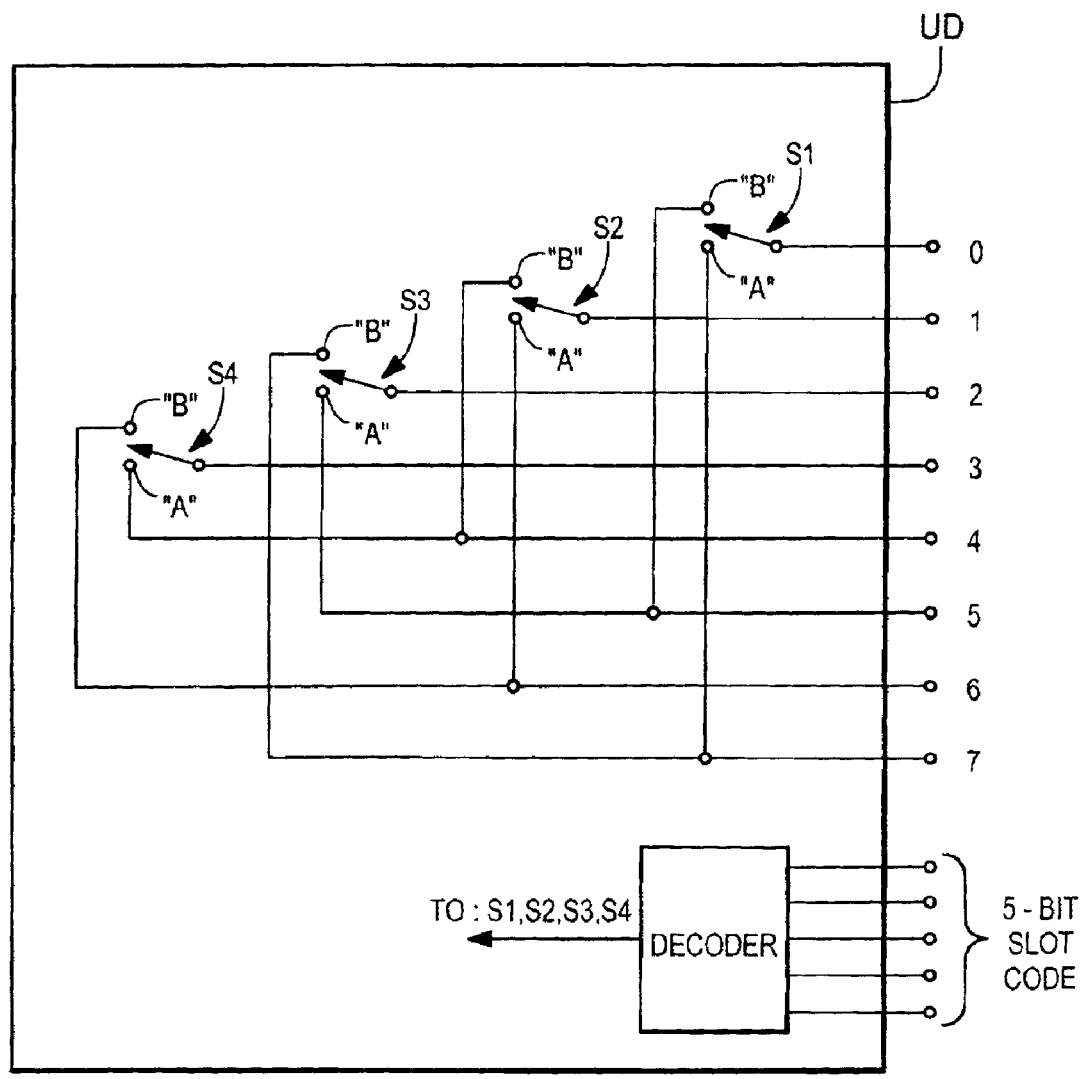
FIG. 14 is a universal director board adapted for use in the system interface of the de-populated system of FIG. 13.

Referring now to FIG. 14, a universal dummy (jumper) director board UD is shown. It should be noted from FIG. 9 that all of the slots in the backplane for the director boards and the memory boards have a unique slot designation. More particularly, the slot designations from left to right are slot 0 through slot 23, as indicated. (This same slot designation applies to the fully populated backplane shown FIG. 8). Thus, the backplane has pins, not shown, hardwired to a 5-bit code representative of the slot designation. Thus, when director D0 plugs into slot 0 of the backplane, such director receives a binary code 00000. Likewise, when memory board M0 is plugged into slot 8 of the backplane provides the code 01000 to the memory board. And so forth for the other director boards and the memory boards.

Referring again to FIG. 14, the universal dummy director (i.e., jumper board) has three switches S1, S2, S3, S4 controlled and a decoder. When the universal board is plugged into a backplane slot, if the decoder thereon detects a code indicating that it is plugged into any of the slots: 17 (i.e., a D9 slot); 19 (i.e., a DB slot); slot 6 (i.e., a D6 slot); or slot 4 (i.e., a D4 slot), a logic 1 is produced by the decoder thereby placing the switches S1, S2, S3 and S4, in a type "A" configuration. When the universal board is plugged into a backplane slot, if the decoder detects that it is plugged into any of the slots: 16 (i.e., a D8 slot); 18 (i.e., a DA slot); slot 7 (i.e., a D7 slot); or slot 5 (i.e., a D5 slot), a logic 0 is produced by the decoder placing the switches S1, S2, S3 and S4 in a type "B" configuration.

In the type "A" condition, the switches S1, S2, S3 and S4, connect: port 0 to port 7; port 1 to port 6, port 2 to port 5; and port 3 to port 4, respectively. When in the type "B" condition, the switches S1, S2, S3 and S4, connect: port 0 to port 5; port 1 to port 4, port 2 to port 7; and port 3 to port 6, respectively. Thus, same universal board UD may be used for any director having jumpers.

Thus, a universal director board UD may be inserted into slots 4, 5, 6, 7, 16, 17, 18 and 19 and the decoders thereon will automatically active the switches S1, S2, S3, S4 to configure the universal boards to those shown in FIG. 11, described above.

It is noted that the signals passing through the director boards are here positive emitter coupled logic (PECL) signals. Further, it is to be noted that the switches S1, S2 and S3 are also used rebufer these signals. Here, the switches S1, S2 and S3 are model VCS-830 switches by Vitesse Semiconductor Corporation, 741 Calle Plano, Camarillo, Calif. 93012.

Other embodiments are within the spirit and scope of the appended claims.

What is claimed is:

1. A method for providing a data storage system for transferring data between a host computer/server and a bank of disk drives through a system interface, such system interface having a plurality of first directors, a plurality of second directors, and a global memory, comprising:

providing a backplane having slots adapted to have plugged therein a plurality of printed circuit board, such printed circuit boards comprising:

a plurality of first director boards having the first directors;

a plurality of second printed circuit boards having the second directors;

a plurality of memory printed circuit boards providing the global memory;

a plurality of dummy first director boards having first jumpers;

a plurality of dummy second director boards having second jumpers;

a plurality of dummy memory boards having third jumpers;

wiring the backplane to effect a connection among the first, second and third jumpers to interconnect the first plurality of director to the host computer/server, the plurality of second plurality of directors to the bank of disk drives and the global memory to the first plurality of directors and to the second plurality of director; and wherein each one of the memory boards has: a common memory array having a pair of redundant data/control ports; and, a pair of logic networks each one coupled to a corresponding one of the pair of data/control ports; and wherein the printed circuit board is wired to effect a connection with the jumpers to enable a pair of the first directors to be coupled to the pair of logic networks and a pair of the second directors to be coupled to the pair of logic networks.

2. The method recited in claim 1 wherein the printed circuit board is wired to effect a connection with the jumpers to connect one of the first directors the memory arrays of a pair of the memory boards.

3. The method recited in claim 2 including providing each one of the directors on a different printed circuit board and wherein the backplane is wired and connected to the jumpers to connect each one of the pair of logic networks to one of the first directors and one of the second directors.

4. A data storage system for transferring data between a host computer/server and a bank of disk drives through a system interface, such system interface having a plurality of first directors, a plurality of second directors, and a global memory, comprising:

a backplane having slots adapted to have plugged therein a plurality of printed circuit board, such printed circuit boards comprising:

a plurality of first director boards having the first directors;

a plurality of second printed circuit boards having the second directors;

a plurality of memory printed circuit boards providing the global memory;

a plurality of dummy first director boards having first jumpers;

a plurality of dummy second director boards having second jumpers;

a plurality of dummy memory boards having third jumpers; wherein the backplane is wired to effect a connection among the first, second and third jumpers to interconnect the first plurality of director to the host computer/server, the plurality of second plurality of directors to the bank of disk drives and the global memory to the first plurality of directors and to the second plurality of director; and wherein each one of the memory boards has: a common memory array having a pair of redundant data/control ports; and, a pair of logic networks each one coupled to a corresponding one of the pair of data/control ports; and wherein the printed circuit board is wired to effect a connection with the jumpers to enable a pair of the first directors to be coupled to the pair of logic networks and a pair of the second directors to be coupled to the pair of logic networks.

5. The system recited in claim 4 wherein the printed circuit board is wired to effect a connection with the jumpers to connect one of the first directors the memory arrays of a pair of the memory boards.

6. The system recited in claim 5 wherein each one of the directors is on a different printed circuit board and wherein the backplane is wired and connected to the jumpers to connect each one of the pair of logic networks to one of the first directors and one of the second directors.

7. The system recited in claim 6 wherein the wired backplane and interconnected jumpers provide separate point-to-point data paths between each one of the directors arid the global memory.

* * * * *